(12) United States Patent
Koo et al.

(10) Patent No.: US 11,955,529 B2
(45) Date of Patent: Apr. 9, 2024

(54) SEMICONDUCTOR DEVICE WITH INTERLAYER INSULATION STRUCTURE INCLUDING METAL-ORGANIC FRAMEWORK LAYER AND METHOD OF MANUFACTURING THE SAME

(71) Applicant: SK hynix Inc., Icheon-si (KR)

(72) Inventors: Won Tae Koo, Icheon-si (KR); Jae Hyun Han, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 36 days.

(21) Appl. No.: 17/543,097

(22) Filed: Dec. 6, 2021

(65) Prior Publication Data
US 2023/0013343 A1   Jan. 19, 2023

(30) Foreign Application Priority Data
Jul. 13, 2021   (KR) .................. 10-2021-0091873

(51) Int. Cl.
| | | |
|---|---|---|
| H01L 29/51 | (2006.01) | |
| H01L 21/28 | (2006.01) | |
| H01L 29/423 | (2006.01) | |
| H10B 41/10 | (2023.01) | |
| H10B 41/27 | (2023.01) | |
| H10B 43/10 | (2023.01) | |
| H10B 43/27 | (2023.01) | |
| H10B 51/10 | (2023.01) | |
| H10B 51/20 | (2023.01) | |

(52) U.S. Cl.
CPC ...... *H01L 29/516* (2013.01); *H01L 29/40111* (2019.08); *H01L 29/40114* (2019.08); *H01L 29/40117* (2019.08); *H01L 29/42324* (2013.01); *H01L 29/4234* (2013.01); *H01L 29/518* (2013.01); *H10B 41/10* (2023.02); *H10B 41/27* (2023.02); *H10B 43/10* (2023.02); *H10B 43/27* (2023.02); *H10B 51/10* (2023.02); *H10B 51/20* (2023.02)

(58) Field of Classification Search
None
See application file for complete search history.

(56) References Cited

U.S. PATENT DOCUMENTS 9,117,771 B2      8/2015   Seifert et al.
2016/0322368 A1*  11/2016  Sun ................... H10B 51/20
2021/0193674 A1*  6/2021   Said .................. H01L 21/02244

FOREIGN PATENT DOCUMENTS

KR      10-2123545 B1    6/2020

* cited by examiner

*Primary Examiner* — Xiaoming Liu

(57) ABSTRACT

A semiconductor device includes a substrate and a gate structure disposed over the substrate. The gate structure includes gate electrode layers and interlayer insulation structures that are alternately stacked with each other. The semiconductor device includes a dielectric structure disposed over the substrate to contact a sidewall surface of the gate structure, and a channel layer disposed on a sidewall surface of the dielectric structure over the substrate. Each of the interlayer insulation structure includes an insulation layer and a metal-organic framework layer that are disposed on the same plane.

17 Claims, 25 Drawing Sheets

FIG. 2
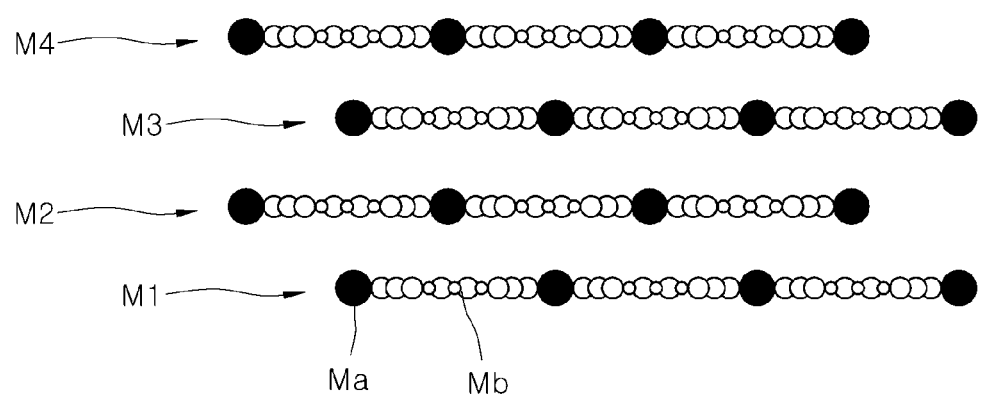
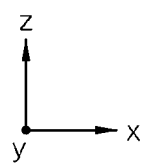

… (1)

SEMICONDUCTOR DEVICE WITH INTERLAYER INSULATION STRUCTURE INCLUDING METAL-ORGANIC FRAMEWORK LAYER AND METHOD OF MANUFACTURING THE SAME

CROSS-REFERENCE TO RELATED APPLICATIONS

The present application claims priority under 35 U.S.C. § 119(a) to Korean Application No. 10-2021-0091873, filed on Jul. 13, 2021 in the Korean Intellectual Property Office, which is incorporated herein by reference in its entirety.

BACKGROUND

1. Technical Field

The present disclosure relates to a semiconductor device, including a plurality of conductive layers and an interlayer insulation structure that insulates the plurality of conductive layers from each other, and a method of manufacturing the same.

2. Related Art

As design rules are reduced, semiconductor devices have adopted a three-dimensional stack structure in order to increase the degree of cell integration. An example of the semiconductor device having a three-dimensional stack structure is a NAND-type flash memory including a channel layer extending in a direction perpendicular to a substrate, and a plurality of memory cells sharing the channel layer with each other. In this example, the gate electrode layers of each of the plurality of memory cells may be disposed to be spaced apart from each other in a direction perpendicular to the substrate. An interlayer insulation layer may be disposed between the gate electrode layers.

Meanwhile, because the three-dimensional stack structure is a structure in which a plurality of memory cells are integrated in a direction perpendicular to the substrate, some of the recent research on three-dimensional stack structure focuses on improving the structural stability of the stack structure and the reliability of signal processing between memory cells adjacent to each other in the vertical direction.

SUMMARY

A semiconductor device according to an embodiment of the present disclosure includes a substrate and a gate structure disposed over the substrate. The gate structure includes gate electrode layers and interlayer insulation structures that are alternately stacked with each other. The semiconductor device includes a dielectric structure disposed over the substrate to contact a sidewall surface of the gate structure, and a channel layer disposed on a sidewall surface of the dielectric structure over the substrate. Each of the interlayer insulation structure includes an insulation layer and a metal-organic framework layer that are disposed on the same plane.

A semiconductor device according to another embodiment of the present disclosure includes a substrate, and an electrode structure disposed over the substrate. The electrode structure includes horizontal electrode layers and interlayer insulation structures that are alternately stacked with each other. The semiconductor device includes a dielectric structure disposed over the substrate to contact a sidewall surface of the electrode structure, and a vertical electrode layer disposed on a sidewall surface of the dielectric structure, over the substrate and extending in a direction perpendicular to a surface of the substrate. The each of the interlayer insulation structure includes an insulation layer and a metal-organic framework layer that are disposed on the same plane.

There is provided a method of manufacturing a semiconductor device according to another embodiment of the present disclosure. In the method, a substrate is prepared. A stack structure is formed over the substrate, the stack structure including first conductive material layers and insulation material layers that are alternately stacked with each other. The stack structure is selectively etched over the substrate to expose a sidewall surface of the stack structure. The insulation material layers of the stack structure are partially removed to form first recess spaces. Metal-organic framework layers are formed to fill the first recess spaces. A dielectric structure is formed over the substrate to contact the metal-organic framework layers and the first conductive material layers. A second conductive material layer is formed over the substrate to contact the dielectric structure.

BRIEF DESCRIPTION OF THE DRAWINGS

FIG. 2 is a schematic view illustrating a metal-organic framework layer according to an embodiment of the present disclosure.

DETAILED DESCRIPTION

Figure 1:
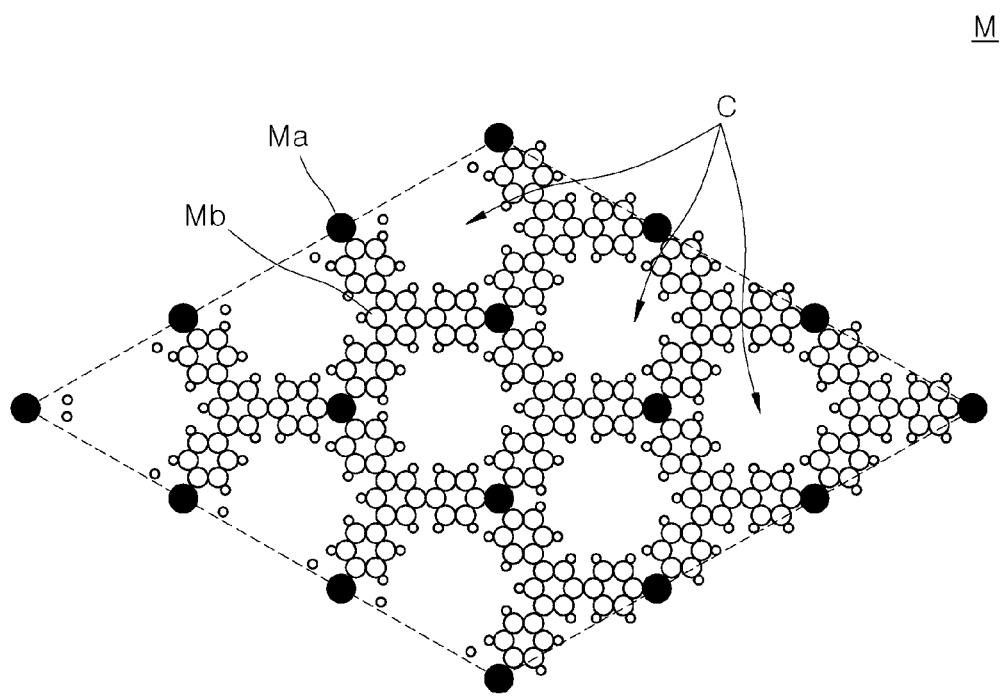
FIG. 1 is a schematic view illustrating a metal-organic framework according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process in the method can take place differently from the stipulated order, unless a specific sequence is described explicitly in the context of the disclosure. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Various embodiments of the present disclosure provide a stack structure disposed on a substrate, wherein the stack structure may include an interlayer insulation structure that electrically insulates different conductive layers adjacent to each other in a direction perpendicular to the substrate. The interlayer insulation structure may include an insulation layer and a metal-organic framework layer. The insulation layer and the metal-organic framework layer may be disposed on the same plane. In this specification, the metal-organic framework layer may refer to a metal-organic framework existing in the form of a thin film or sheet. The metal-organic framework may refer to a porous material formed by bonding a node including metal to an organic ligand. The metal-organic framework may have a two-dimensional structure or a three-dimensional structure.

FIG. 1 is a schematic view illustrating a metal-organic framework according to an embodiment of the present disclosure. FIG. 2 is a schematic view illustrating a metal-organic framework layer according to an embodiment of the present disclosure.

Referring to FIG. 1, a metal-organic framework M of a two-dimensional structure is disclosed. The metal-organic framework M may be a material formed by a coordination bond between a metal-containing node Ma and an organic ligand Mb.

The metal-containing node Ma may be, for example, a metal ion or a metal cluster. The metal may include, for example, zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), aluminum (Al), or the like.

The organic ligand Mb may include, for example, oxalic acid, fumaric acid, benzenehexathiol, triphenylenehexathiol, 1,4-benzene dicarboxylic acid, hexaaminobenzene, tetrakis (4-carboxyphenyl)-porphyrinato-cobalt (II), tetrakis (4-carboxyphenyl)-porphyrin, or the like. As another example, the organic ligand Mb may include $H_2BDC$, $H_2BDC$-Br, $H_2BDC$-OH, $H_2BDC$-$NO_2$, $H_2BDC$-$NH_2$, $H_4DOT$, $H_2BDC$-$(Me)_2$, $H_2BDC$-$(Cl)_2$, or the like.

Referring to FIG. 1, the metal-organic framework M of a two-dimensional structure may have a porous structure having cavities C therein. In an embodiment, the metal-organic framework M may have a physically and chemically stable two-dimensional mesh bonding structure. As illustrated in FIG. 1, in the metal-organic framework M, the coordination bonds between the metal-containing nodes Ma and the organic ligands Mb may be regularly formed in two dimensions. As a result, the metal-organic framework M may exist in the form of a sheet having a thickness of a nano size (e.g., 1 nm to 100 nm).

In some embodiments, unlike that illustrated in FIG. 1, the metal-organic framework M may have a three-dimensional structure. In such embodiments, each of the metal-containing nodes Ma and each of the organic ligands Mb of the metal-organic framework M may be respectively disposed at fixed positions within a three-dimensional unit lattice. The metal-organic framework M having a three-dimensional structure may include, for example, zeolitic imidazolate frameworks such as ZIF-N (where N is 1 to 12). The metal-organic framework M having a three-dimensional structure may be a porous structure having cavities C therein.

Referring to FIG. 2, a metal-organic framework layer N including a plurality of metal-organic frameworks M1, M2, M3, and M4 is disclosed. Each of the plurality of metal-organic frameworks M1, M2, M3, and M4 may be substantially the same as the metal-organic framework M of a two-dimensional structure described above with reference to FIG. 1.

As illustrated in FIG. 2, the metal-organic framework layer N may have a form in which the plurality of metal-organic frameworks M1, M2, M3, and M4 having a two-dimensional structure are stacked in a thickness direction (i.e., z-direction). Each of the plurality of metal-organic frameworks M1, M2, M3, and M4 may be bonded to each other in a direction (i.e., z-direction) perpendicular to a surface of the sheet by Van der Waals forces, thereby forming a thin film in which the sheets are stacked. The metal-organic framework layer N may have electrical insulation properties.

Referring to FIGS. 1 and 2, the metal-organic framework layer N may have a low permittivity due to the cavities C provided in the plurality of metal-organic frameworks M1, M2, M3, and M4. For instance, the permittivity of the metal-organic framework layer N may be lower than that of silicon oxide. As an example, the dielectric constant K of the metal-organic framework layer N may be two (2) or less. In addition, the metal-organic framework M of FIG. 1 has a stable two-dimensional mesh bonding structure, so the metal-organic framework layer N, which is a stack structure of the plurality of metal-organic frameworks M, may also have and maintain a structurally stable state.

In some embodiments, unlike those illustrated in FIGS. 1 and 2, the metal-organic framework layer N may include the above-described metal-organic framework having a three-dimensional structure (not illustrated). The metal-organic framework M of a three-dimensional structure includes cavities, so the resulting metal-organic framework layer N may have a low permittivity. As an example, the metal-organic framework layer N may have a dielectric constant K of two or less.

Figure 3:
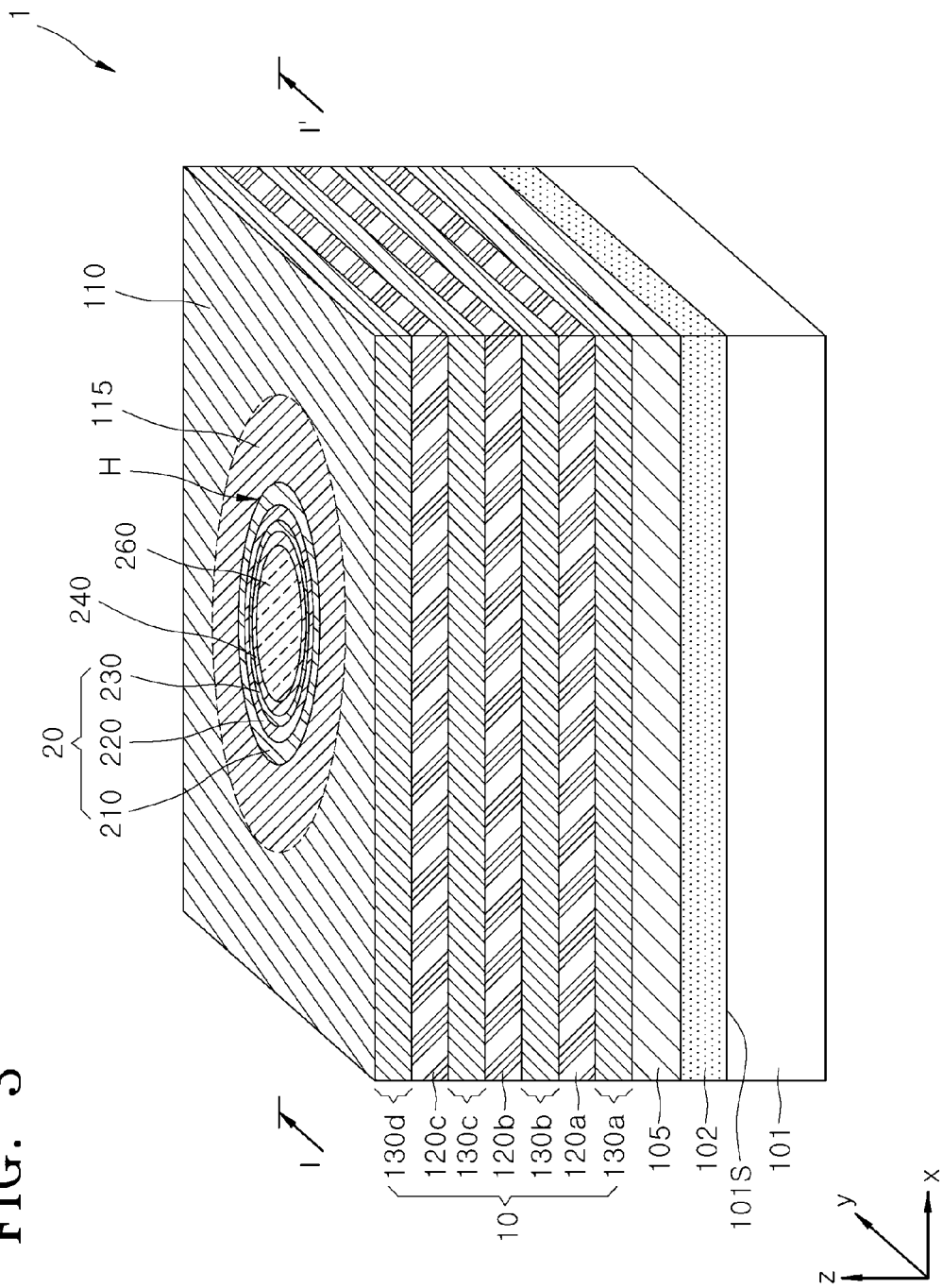
FIG. 3 is a schematic perspective view illustrating a semiconductor device according to an embodiment of the present disclosure.
Figure 4:
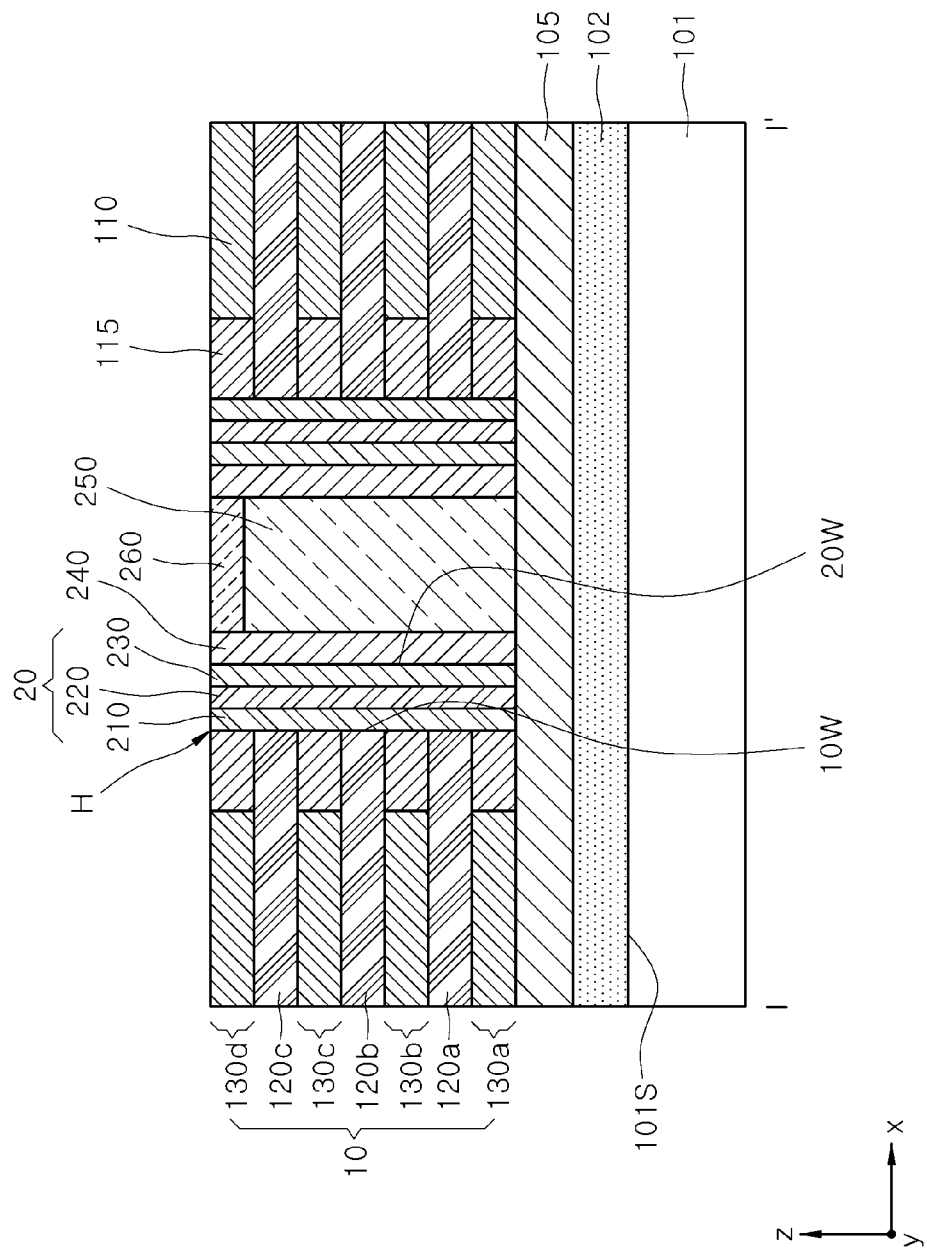
FIG. 4 is a cross-sectional view taken along the line I-I' of the semiconductor device of FIG. 3.
Figure 5:
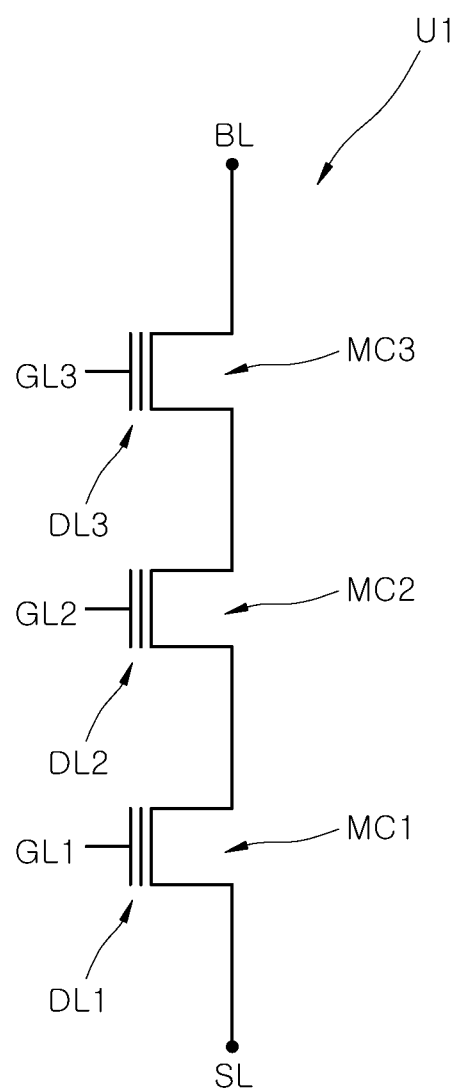
FIG. 5 is an electrical circuit diagram of the semiconductor device illustrated in FIGS. 3 and 4.
Figure 6:
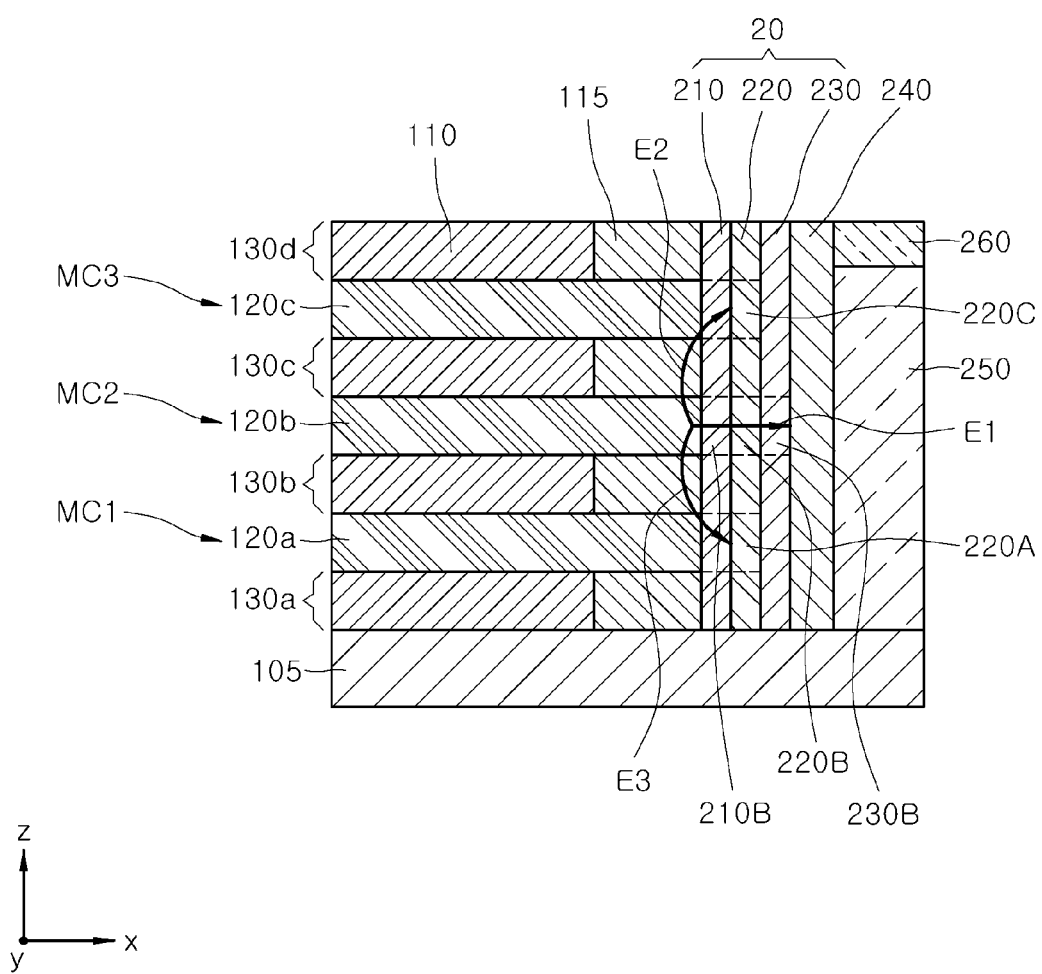
FIG. 6 is a schematic diagram illustrating a function of an interlayer insulation structure of the semiconductor device illustrated in FIGS. 3 and 4.

FIG. 3 is a schematic perspective view illustrating a semiconductor device according to an embodiment of the present disclosure. FIG. 4 is a cross-sectional view taken along the line I-I' of the semiconductor device of FIG. 3. FIG. 5 is an electrical circuit diagram of the semiconductor device illustrated in FIGS. 3 and 4. FIG. 6 is a schematic diagram illustrating a function of an interlayer insulation structure of the semiconductor device illustrated in FIGS. 3 and 4.

Referring to FIGS. 3 and 4, a semiconductor device 1 may include a substrate 101, a gate structure 10 disposed over the substrate 101, a dielectric structure 20 disposed to contact a sidewall surface 10W of the gate structure 10 over the substrate 101, and a channel layer 240 disposed on a sidewall surface 20W of the dielectric structure 20 over the substrate 101. The channel layer 240 may extend in a first direction (i.e., the z-direction) perpendicular to a surface 101S of the substrate. A channel lower contact layer 105 and a channel upper contact layer 260 may be disposed to contact both ends of the channel layer 240 extending in the z-direction.

Referring to FIGS. 3 and 4, the substrate 101 may include a semiconductor material. Specifically, the semiconductor material may include silicon (Si), germanium (Ge), gallium arsenide (GaAs), or the like. A base insulation layer 102 may be disposed on the substrate 101. The base insulation layer 102 may include an insulation material. The insulation material may include, for example, oxide, nitride, oxynitride, or a combination of two or more thereof.

Although not illustrated in FIG. 1, the substrate 101 may include an integrated circuit. The integrated circuit may configure an active device such as a diode or a transistor, as an example. At least one conductive layer and one insulation layer may be disposed between the substrate 101 and the base insulation layer 102. The conductive layer may configure an electrical interconnection.

Referring to FIGS. 3 and 4 together, the channel lower contact layer 105 may be disposed on the base insulation layer 102. The channel lower contact layer 105 may be electrically connected to the channel layer 240. Although not illustrated, the channel lower contact layer 105 may be electrically connected to a source line.

The channel lower contact layer 105 may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 3 and 4, the gate structure 10 may be disposed on the channel lower contact layer 105. The gate structure 10 may include first to third gate electrode layers 120a, 120b, and 120c and first to fourth interlayer insulation structures 130a, 130b, 130c, and 130d, which are alternately stacked in the first direction (i.e., the z-direction) perpendicular to the surface 101S of the substrate 101. The first interlayer insulation structure 130a may be disposed to contact the channel lower contact layer 105. The fourth interlayer insulation structure 130d may be disposed as an uppermost layer of the gate structure 10. Although, as illustrated in FIGS. 3 and 4, the gate structure 10 includes three gate electrode layers and four interlayer insulation structures, the present disclosure is not limited thereto. The number of gate electrode layers included in the gate structure 10 may be variously modified. In addition, the number of interlayer insulation structures that insulate the gate electrode layers in the first direction (i.e., the z-direction) may also be modified.

Each of the first to third gate electrode layers 120a, 120b, and 120c may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 4, each of the first to fourth interlayer insulation structures 130a, 130b, 130c, and 130d may include an insulation layer 110 and a metal-organic framework layer 115. The insulation layer 110 may have a larger volume in each of the first to fourth interlayer insulation structures 130a, 130b, 130c, and 130d than the metal-organic framework layer 115. The insulation layers 110 and the metal-organic framework layers 115 may be disposed to contact each other in a direction parallel to the surface 101S of the substrate 101. Referring to FIGS. 3 and 4, among the insulation layers 110 and the metal-organic framework layers 115, the metal-organic framework layers 115 may be disposed closer to the dielectric structure 20 than the insulation layers 110.

Each of the metal-organic framework layers 115 may have a dielectric constant that is lower than each of the insulation layers 110. The metal-organic framework layer 115 may have, for example, a dielectric constant of two (2) or less.

Each of the insulation layers 110 may include an inorganic insulation material. The insulation material may include, for example, oxide, nitride, oxynitride, or a combination of two or more thereof. Each of the metal-organic framework layers 115 may include a metal-organic framework M described above with reference to FIG. 1. The metal-organic framework layer 115 may be a metal-organic framework layer N described above with reference to FIG. 2. That is, the metal-organic framework layer 115 may have a form in which a plurality of metal-organic frameworks M1, M2, M3, and M4 having a sheet shape are stacked as illustrated in FIG. 2. In addition, the metal-organic framework layers 115 may have electrical insulative properties.

Referring to FIGS. 3 and 4, the gate structure 10 may include a hole pattern H. The hole pattern H may penetrate the gate structure 10 in the vertical direction (e.g., the z-direction) to expose the channel lower contact layer 105. In addition, the hole pattern H may expose the sidewall surface 10W of the gate structure 10.

The dielectric structure 20 may be disposed in the hole pattern H on the channel lower contact layer 105. Specifically, the dielectric structure 20 may be disposed to contact the sidewall surface 10W of the gate structure 10. The dielectric structure 20 may be a structure extending in the first direction (i.e., the z-direction) perpendicular to the substrate 101 on the channel lower contact layer 105. The dielectric structure 20 may be a charge storage structure of a flash memory device.

The dielectric structure 20 may include a barrier layer 210, a charge storage layer 220, and a tunneling layer 230. The barrier layer 210 may be disposed on the sidewall surface 10W of the gate structure 10. The barrier layer 210 may contact the first to third gate electrode layers 120a, 120b, and 120c of the gate structure 10 and the metal-organic framework layers 115 of the first to fourth interlayer insulation structures 130a, 130b, 130c, and 130d. The charge storage layer 220 may be disposed on a sidewall surface of the barrier layer 210. The tunneling layer 230 may be disposed on a sidewall surface of the charge storage layer 220. Each of the barrier layer 210, the charge storage layer 220, and the tunneling layer 230 may include oxide, nitride, oxynitride, or a combination of two or more thereof.

Referring to FIGS. 3 and 4, the channel layer 240 may be disposed in the hole pattern H on the lower channel contact layer 105. The channel layer 240 may be disposed on the sidewall surface 20W of the dielectric structure 20. Specifically, the channel layer 240 may be disposed to contact the tunneling layer 230 of the dielectric structure 20. The channel layer 240 may extend in the first direction (i.e., the z-direction) perpendicular to the substrate surface 101S on the channel lower contact layer 105.

The channel layer 240 may include a semiconductor material. The semiconductor material may include, for example, silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide may include, for example, molybdenum selenide ($MoSe_2$), hafnium selenide ($HfSe_2$), indium selenide (InSe), gallium selenide (GaSe), or the like. The semiconductor material may include, for example, a metal oxide such as indium-gallium-zinc oxide (IGZO). The channel layer 240 may have conductivity. As an example, the channel layer 240 may be doped with an n-type or p-type dopant.

Referring to FIGS. 3 and 4, a filling insulation structure 250 may be disposed inside the hole pattern H in which the dielectric structure 20 and the channel layer 240 are disposed. The filling insulation structure 250 may include, for example, oxide, nitride, oxynitride, or a combination of two or more thereof.

In addition, in the hole pattern H, a channel upper contact layer 260 may be disposed on the filling insulation structure 250. The channel upper contact layer 260 may be electrically connected to the channel layer 240. Although not illustrated, the channel upper contact layer 260 may be electrically connected to a bit line.

The channel upper contact layer 260 may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In FIGS. 3 and 4, although the channel upper contact layer 260 is illustrated to be disposed inside the hole pattern H, the present disclosure is not limited thereto. In some embodiments, the channel upper contact layer 260 may be disposed outside the hole pattern H. As an example, the channel upper contact layer 260 may be disposed on the gate structure 10 to be electrically connected to the channel layer 240.

Referring to the circuit diagram U1 of FIG. 5, the semiconductor device 1 may include first to third memory cells MC1, MC2, and MC3 in the form of transistors connected in series between a source line SL and a bit line BL. The semiconductor device 1 may be a NAND-type flash memory device having a string shape.

The first to third memory cells MC1, MC2, and MC3 may include corresponding first to third gate electrodes GL1, GL2, and GL3 and first to third dielectric structures DL1, DL2, and DL3, respectively. The first to third gate electrodes GL1, GL2, and GL3 of FIG. 5 may correspond to the first to third gate electrode layers 120a, 120b, and 120c in the semiconductor device 1 of FIGS. 3 and 4, respectively. The first to third dielectric structures DL1, DL2, and DL3 of FIG. 5 may correspond to regions of the dielectric structures 20 electrically controlled by the first to third gate electrode layers 120a, 120b, and 120c in the semiconductor device 1 of FIGS. 3 and 4, respectively.

The functions of the first to fourth interlayer insulation structures 130a, 130b, 130c, and 130d, including the insulation layers 110 and the metal-organic framework layers 115, will be described with reference to FIG. 6. The metal-organic framework layers 115 may be portions adjacent to the dielectric structure 20 that overlap the first to third gate electrode layers 120a, 120b, and 120c in the z-direction. The insulation layers 110 may be disposed farther away than the metal-organic framework layers 115 from the dielectric structure 20.

The metal-organic framework layers 115 may effectively suppress signal interference between the first to third memory cells MC1, MC2, and MC3 when a program or erase operation of the semiconductor device 1 is performed. As an example, referring to FIG. 6, a signal interference suppression effect of a metal-organic framework layers 115 when a program or erase operation is performed on a second memory cell MC2 including the second gate electrode layer 120b will be described below.

First, a channel voltage may be applied between the channel lower contact layer 105 and the channel upper contact layer 260, so that electrons may conduct within the channel layer 240 in the z-direction. Subsequently, a program voltage having a positive polarity or an erase voltage having a negative polarity may be applied to the second gate electrode layer 120b to form an electric field between the second gate electrode layer 120b and the channel layer 240.

The electric field may include a program electric field E1 acting on regions of the second memory cell MC2, which include for example, a portion 210B of the barrier layer 210, a portion 220B of the charge storage layer 220, and a portion 230B of the tunneling layer 230. In addition, fringing electric fields E2 and E3 may be formed by bypassing the outside of the regions of the second memory cell MC2. For example, one fringing electric field E2 may exert an electric attractive or repulsive force on the electric charge stored in a portion 220C of the charge storage layer 220 of the third memory cell MC3, which is electrically controlled by the third gate electrode layer 120c. An amount of the charge stored in the portion 220C of the charge storage layer 220 of the third memory cell MC3 may be changed due to the electric attractive or repulsive force. Likewise, another fringing electric field E3 may exert an electric attractive or repulsive force on the electric charge stored in a portion 220A of the charge storage layer 220 of the first memory cell MC1, which is electrically controlled by the first gate electrode layer 120a. An amount of the charge stored in the portion 220A of the charge storage layer 220 of the first memory cell MC1 may be changed due to the electric attractive or repulsive force. As described above, the fringing electric fields E2 and E3 generated from the second gate electrode layer 120b of the second memory cell MC2 may change the signal information stored in the first and third memory cells MC1 and MC3.

In the same manner, when a gate voltage is applied between the first gate electrode layer 120a of the first memory cell MC1 and the channel layer 240, or between the third gate electrode layer 120c of the third memory cell MC3 and the channel layer 240, a program electric field and a fringing electric field may be generated. The fringing electric field may change the amount of the charge stored in the portion 220B of the charge storage layer 220 of the second memory cell MC2. As a result, the fringing electric field generated from at least one of the first and third memory cells MC1 and MC3 adjacent to the second memory cell MC2 may change the signal information stored in the second memory cell MC2.

Referring again to FIG. 6, in an embodiment of the present disclosure, each of the first to fourth interlayer insulation structures 130a, 130b, 130c, and 130d may include the metal-organic framework layer 115 having cavities, adjacent to the dielectric structure 20. The cavities may weaken or suppress the fringing electric field passing through the metal-organic framework layers 115. Accordingly, deterioration of signal information of the memory cell caused by the fringing electric field may be reduced, and reliability of the signal information may be improved.

In addition, each of the metal-organic framework layers 115 may have a low dielectric constant of 2 or less, for example. The metal-organic framework layers 115 may effectively reduce parasitic capacitance generated in the z-direction between portions adjacent to the dielectric structure 20 among the first to third gate electrode layers 120a, 120b, and 120c.

Referring again to FIG. 6, the insulation layers 110 may serve to support the gate structure 10. The insulation layers 110 may have superior rigidity compared to the metal-organic framework layers 115. Accordingly, in contrast to a case in which the entire first to fourth interlayer insulation structures 130a, 130b, 130c, and 130d are made of only the metal-organic framework layer 115, the embodiment of the present disclosure including the insulation layers 110 and the metal-organic framework layers 115 together may improve the structural stability of the gate structure 10. In an embodiment, the insulation layers 110 may have volume fractions in the interlayer insulation structure 130a, 130b, 130c, and 130d greater than those of the metal-organic framework layers 115.

In addition, the height of each of the first to fourth interlayer insulation structures 130a, 130b, 130c, and 130d may be reduced because the above-described signal interference control effect and the parasitic capacitance reduction effect of the metal-organic framework layers 115 allows less space between memory cells in the vertical direction. Accordingly, by reducing the height of each of the first to fourth interlayer insulation structures 130a, 130b, 130c, and 130d in the z-direction, the number of stacked memory cells may be increased. As a result, the memory cell integration degree of a semiconductor device 1 may be improved.

Figure 7:
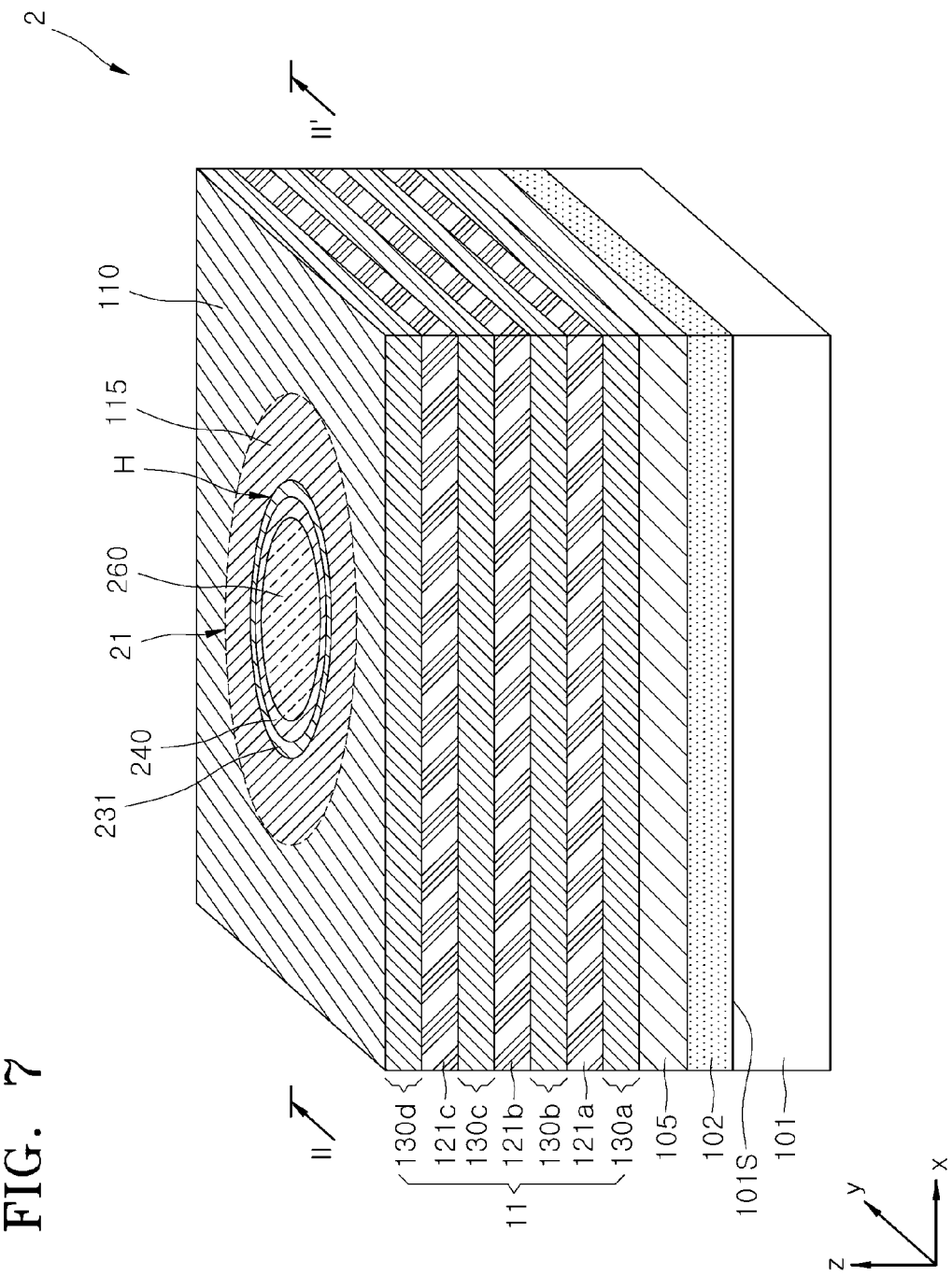
FIG. 7 is a schematic perspective view illustrating a semiconductor device according to another embodiment of the present disclosure.
Figure 8:
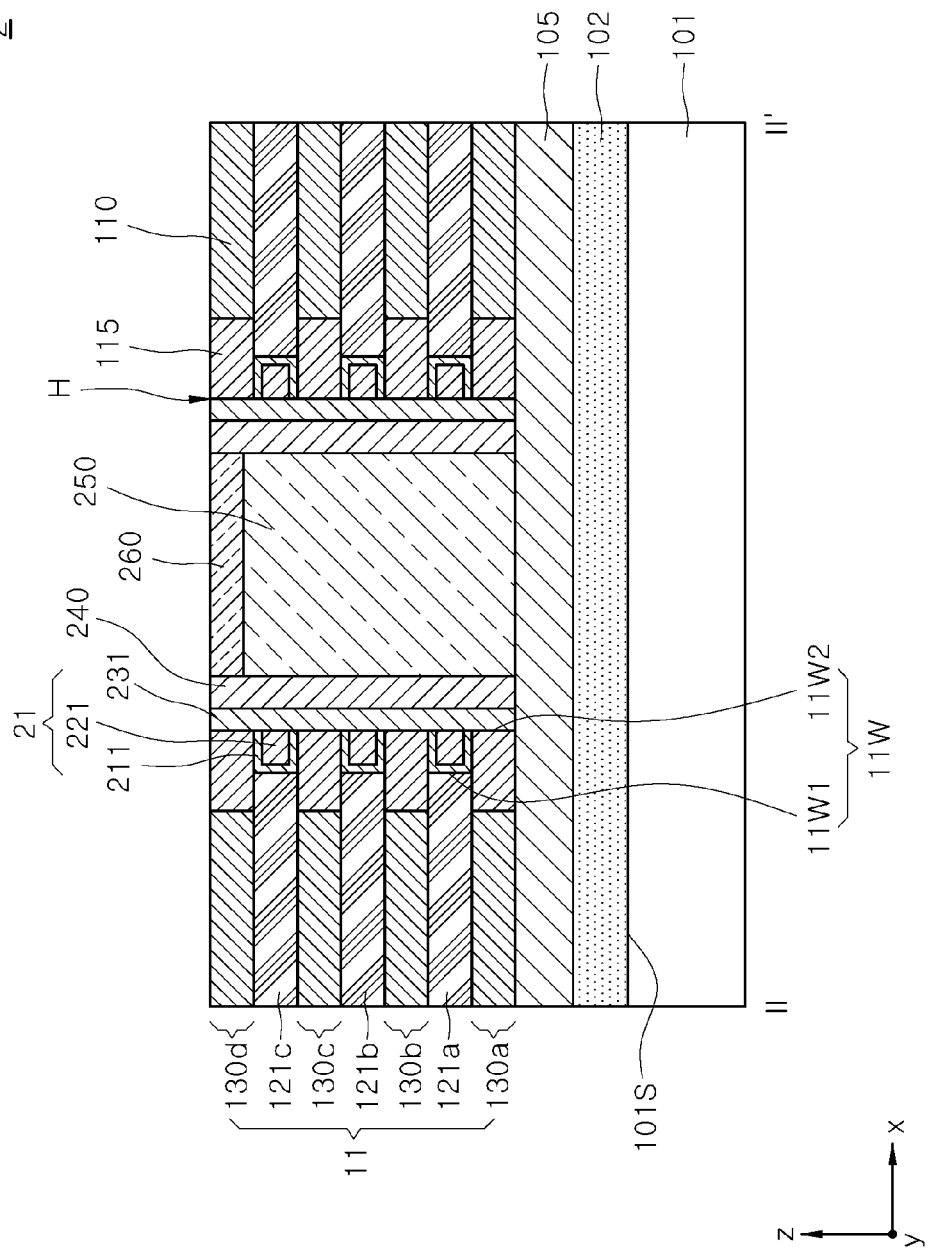
FIG. 8 is a cross-sectional view taken along the line II-II" of the semiconductor device of FIG. 7.
Figure 9:
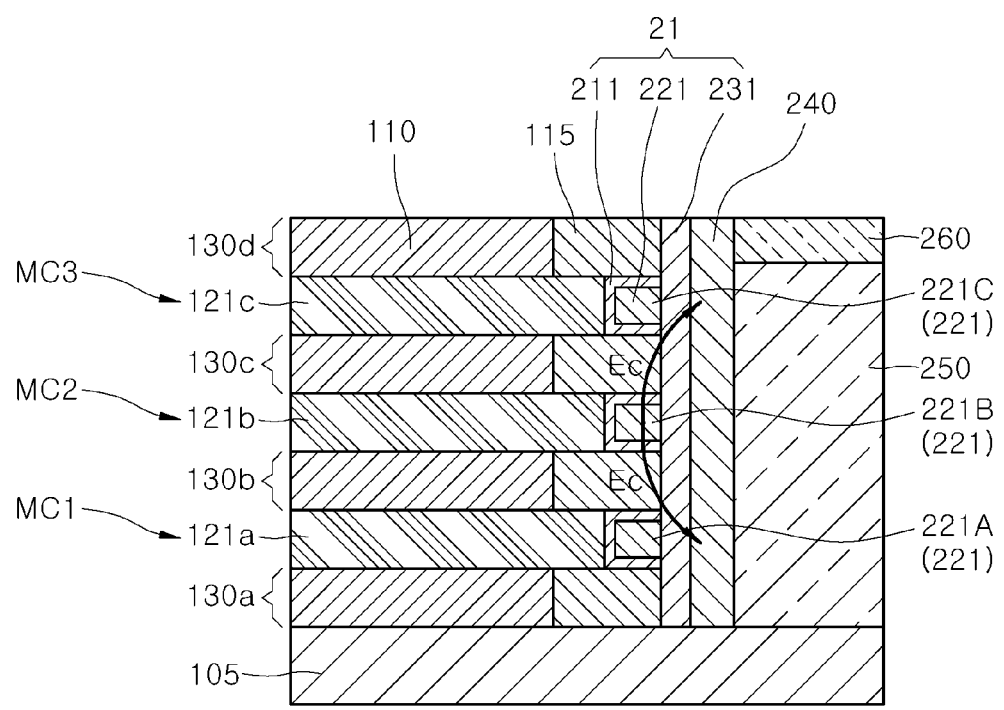
FIG. 9 is a schematic diagram illustrating a function of an interlayer insulation structure of the semiconductor device illustrated in FIGS. 7 and 8.

FIG. 7 is a schematic perspective view illustrating a semiconductor device according to another embodiment of the present disclosure. FIG. 8 is a cross-sectional view taken along the line II-II' of the semiconductor device of FIG. 7. FIG. 9 is a schematic diagram illustrating a function of an interlayer insulation structure of the semiconductor device of FIGS. 7 and 8.

Compared with the semiconductor device 1 of FIGS. 3 and 4, a semiconductor device 2 of FIGS. 7 and 8 is different from the semiconductor device 1 of FIGS. 3 and 4 in the configurations of a gate structure 11 and a dielectric structure 21. Configurations other than the configurations of the gate structure 11 and the dielectric structure 21 of the semiconductor device 2 of FIGS. 7 and 8 are substantially the same as the configurations of those of the semiconductor device 1.

Referring to FIGS. 7 and 8, the gate structure 11 may include first to third gate electrode layers 121a, 121b, and 121c and first to fourth interlayer insulation structures 130a, 130b, 130c, and 130d, which are alternately stacked on a channel lower contact layer 105.

Referring to FIG. 8, a sidewall surface 11W of the gate structure 11 may include sidewall surfaces 11W1 of the first to third gate electrode layers 121a, 121b, and 121c and sidewall surfaces 11W2 of the first to fourth interlayer insulation structures 130a, 130b, 130c, and 130d. The sidewall surfaces 11W1 of the first to third gate electrode layers 121a, 121b, and 121c may be located farther from a channel layer 240 than the sidewall surfaces 11W2 of the first to fourth interlayer insulation structures 130a, 130b, 130c, and 130d, in a direction parallel to a surface 101S of the substrate 101. That is, the first to third gate electrode layers 121a, 121b, and 121c may be recessed in a direction away from the channel layer 240 relative to the sidewall surfaces 11W2 of the first to fourth interlayer insulation structures 130a, 130b, 130c, and 130d.

The dielectric structure 21 may include a barrier layer 211, a charge storage layer 221, and a tunneling layer 231. The barrier layer 211 and the charge storage layer 221 of the dielectric structure 21 may be disposed in spaces formed by recessing the first to third gate electrode layers 121a, 121b, and 121c away from the channel layer 240. Specifically, the barrier layer 211 may contact metal-organic framework layers 115 in a direction perpendicular to a surface 101S of the substrate 101, and may contact the first to third gate electrode layers 121a, 121b, and 121c and the tunneling layer 231 in a direction parallel to the surface 101S of the substrate 101. The charge storage layer 221 may be disposed on a sidewall surface of the barrier layer 211 and may contact the tunneling layer 231 in a direction parallel to the surface 101S of the substrate 101. The tunneling layer 231 may extend in a direction perpendicular to the surface 101S of the substrate 101 and may be disposed to contact the metal-organic structure layers 115, the barrier layer 211, and the charge storage layer 221.

Referring to FIG. 9, the barrier layer 211 and the charge storage layer 221 of the dielectric structure 21 may be arranged separately for each of the first to third memory cells MC1, MC2, and MC3. As an example, the charge storage layer 221 may include first to third charge storage regions 221A, 221B, and 221C, which are portions of the charge storage layer 221 that are separated from each other for each of the first to third memory cells MC1, MC2, and MC3, respectively. The first to third charge storage regions 221A, 221B, and 221C may be disposed between the metal-organic framework layers 115 along the z-direction. The metal-organic framework layers 115 may effectively suppress signal interference to neighboring memory cells that can be caused by charges stored in the first to third charge storage regions 221A, 221B, and 221C.

Referring to FIG. 9, in an embodiment, when charges are stored in the charge storage region 221B of the second memory cell MC2, an electric field Ec may be generated by the charges. The electric field Ec may act on regions of the channel layer 240 of the first and third memory cells MC1 and MC3 adjacent to each other. As an example, the electric field Ec may change the channel threshold voltages of the first and third memory cells MC1 and MC3 to change the amount of charges flowing from the channel layer 240 into the charge storage regions 221A and 221C. Accordingly, signal information stored in the first and third memory cells MC1 and MC3 may be changed.

Referring again to FIG. 9, in an embodiment of the present disclosure, each of the first to fourth interlayer insulation structures 130a, 130b, 130c, and 130d may include a metal-organic framework layer 115 having cavities. The cavities may weaken or suppress the electric field Ec passing through the metal-organic framework layers 115. Accordingly, it is possible to reduce the deterioration of signal information of the neighboring memory cells by the electric field Ec generated by the electric charges stored in the memory cells. As a result, operational reliability of semiconductor devices including a plurality of memory cells may be improved.

Figure 10:
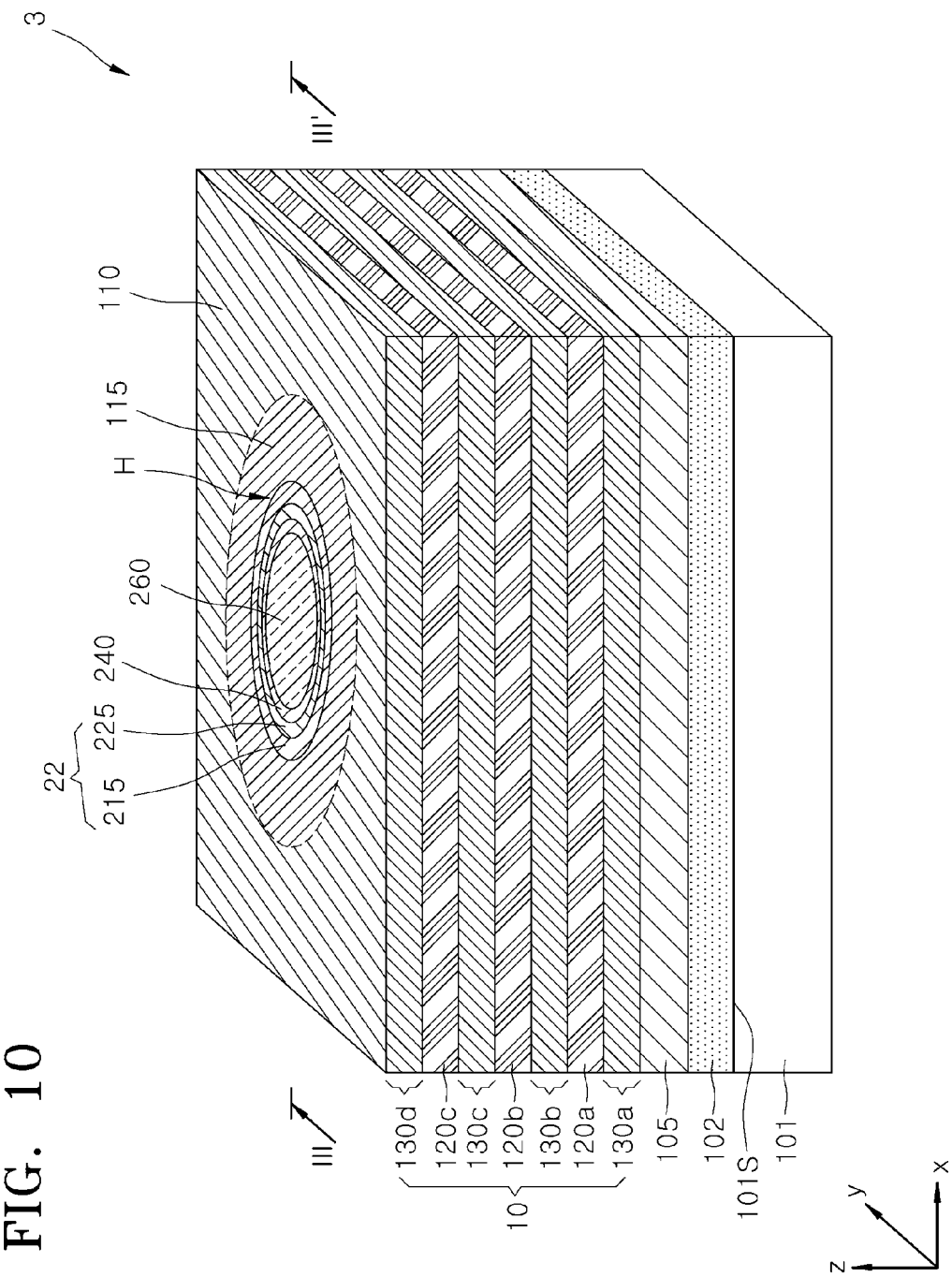
FIG. 10 is a schematic perspective view illustrating a semiconductor device according to another embodiment of the present disclosure.
Figure 11:
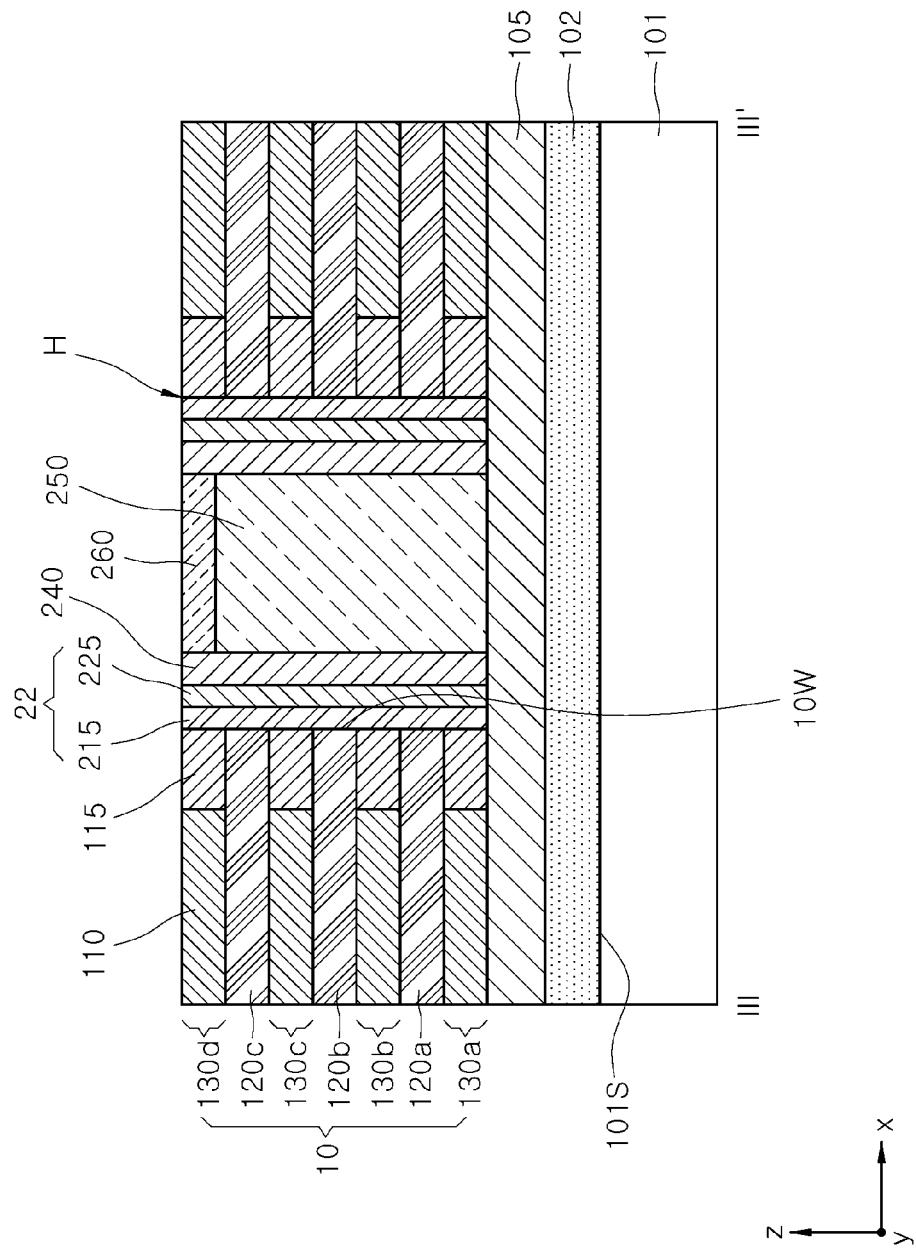
FIG. 11 is a cross-sectional view taken along the line III-III" of the semiconductor device of FIG. 10.
Figure 12:
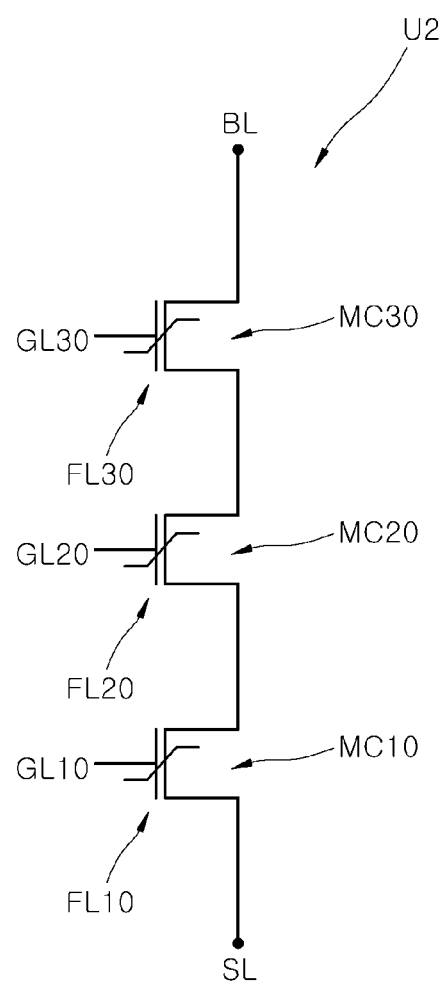
FIG. 12 is a schematic electrical circuit diagram of the semiconductor device of FIG. 10.

FIG. 10 is a schematic perspective view illustrating a semiconductor device according to another embodiment of the present disclosure. FIG. 11 is a cross-sectional view taken along the line III-III' of the semiconductor device of FIG. 10. FIG. 12 is a schematic electrical circuit diagram of the semiconductor device of FIG. 10. The configuration of a dielectric structure 22 of a semiconductor device 3 of FIGS. 10 and 11 is different from that of the semiconductor device 1 of FIGS. 3 and 4. Configurations other than the configurations of the dielectric structure 22 of the semiconductor device 3 of FIGS. 10 and 11 are substantially the same as the configurations of those of the semiconductor device 1.

Referring to FIGS. 10 and 11, the semiconductor device 3 may be a ferroelectric memory device. The dielectric structure 22 of the semiconductor device 3 may include, on a channel lower contact layer 105, a ferroelectric memory layer 215 disposed on a sidewall surface 10W of a gate structure 10, and an interfacial insulation layer 225 disposed on a sidewall surface of the ferroelectric memory layer 215.

The ferroelectric memory layer 215 may include a ferroelectric material. The ferroelectric material may include, for example, a binary metal oxide such as hafnium oxide or zirconium oxide. As another example, the ferroelectric material may include a perovskite-based material such as lead zirconate titanate (PZT) or strontium bismuth titanate (SBT).

The interfacial insulation layer 225 may include, for example, oxide, nitride, oxynitride, or the like. Specifically, the interfacial insulation layer 225 may include silicon oxide, silicon nitride, silicon oxynitride, aluminum oxide, aluminum nitride, or the like. The interface insulation layer 225 may function as a buffer layer between the ferroelectric memory layer 215 and a channel layer 240.

Referring to the circuit diagram U2 of FIG. 12, the semiconductor device 3 may include first to third memory cells MC10, MC20, and MC30 in the form of transistors connected in series between a source line SL and a bit line BL.

The first to third memory cells MC10, MC20, and MC30 may include corresponding first to third gate electrodes GL10, GL20, and GL30 and first to third ferroelectric memory elements FL10, FL20, and FL30, respectively. Each of the first to third ferroelectric memory elements FL10, FL20, and FL30 may have a memory characteristic capable of non-volatile storage of electrical polarization. The first to third gate electrodes GL10, GL20, and GL30 may correspond to the first to third gate electrode layers 120a, 120b, and 120c in the semiconductor device 3 of FIGS. 10 and 11, respectively. The first to third ferroelectric memory elements FL10, FL20, and FL30 may correspond to portions of the ferroelectric memory layer 215, electrically controlled by the first to third gate electrode layers 120a, 120b, and 120c, in the semiconductor device 3 of FIGS. 10 and 11, respectively.

Referring to FIGS. 10 and 11, metal-organic framework layers 115 of the first to fourth interlayer insulation structures 130a, 130b, 130c, and 130d may be disposed adjacent to the dielectric structure 22. The metal-organic framework layers 115 have cavities. When a voltage is applied between the gate electrode layers 120a, 120b, and 120c and a channel layer 240, the cavities may weaken or suppress the fringing electric field passing through the metal-organic structure layers 115. Accordingly, a phenomenon in which the electrical polarization programmed in the ferroelectric layer portion of a neighboring memory cell is changed by the fringing electric field generated in a memory cell may be suppressed. Accordingly, reliability of signal information corresponding to the electrical polarization of the memory cell may be improved.

Figure 13:
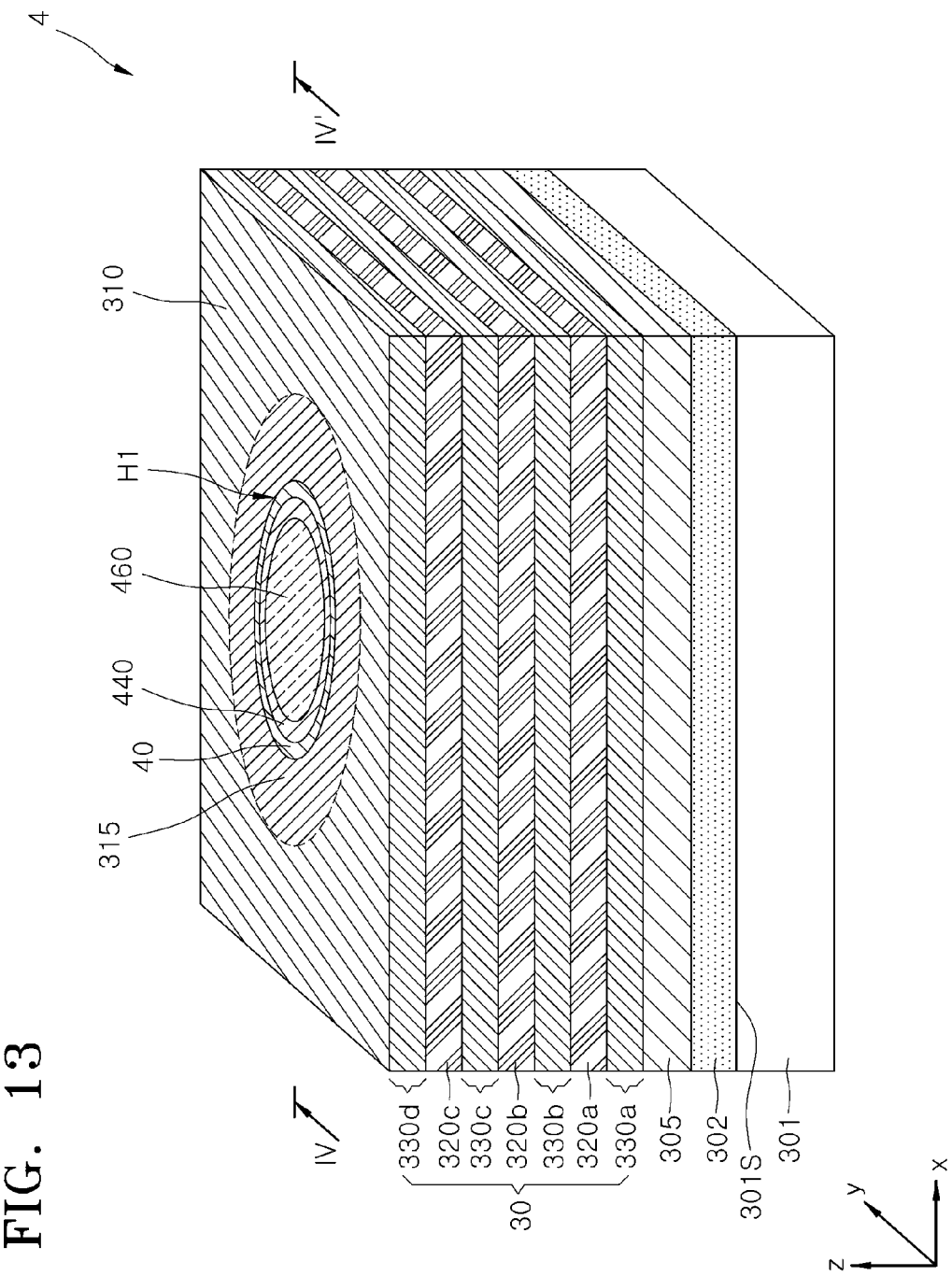
FIG. 13 is a schematic perspective view illustrating a semiconductor device according to another embodiment of the present disclosure.
Figure 14:
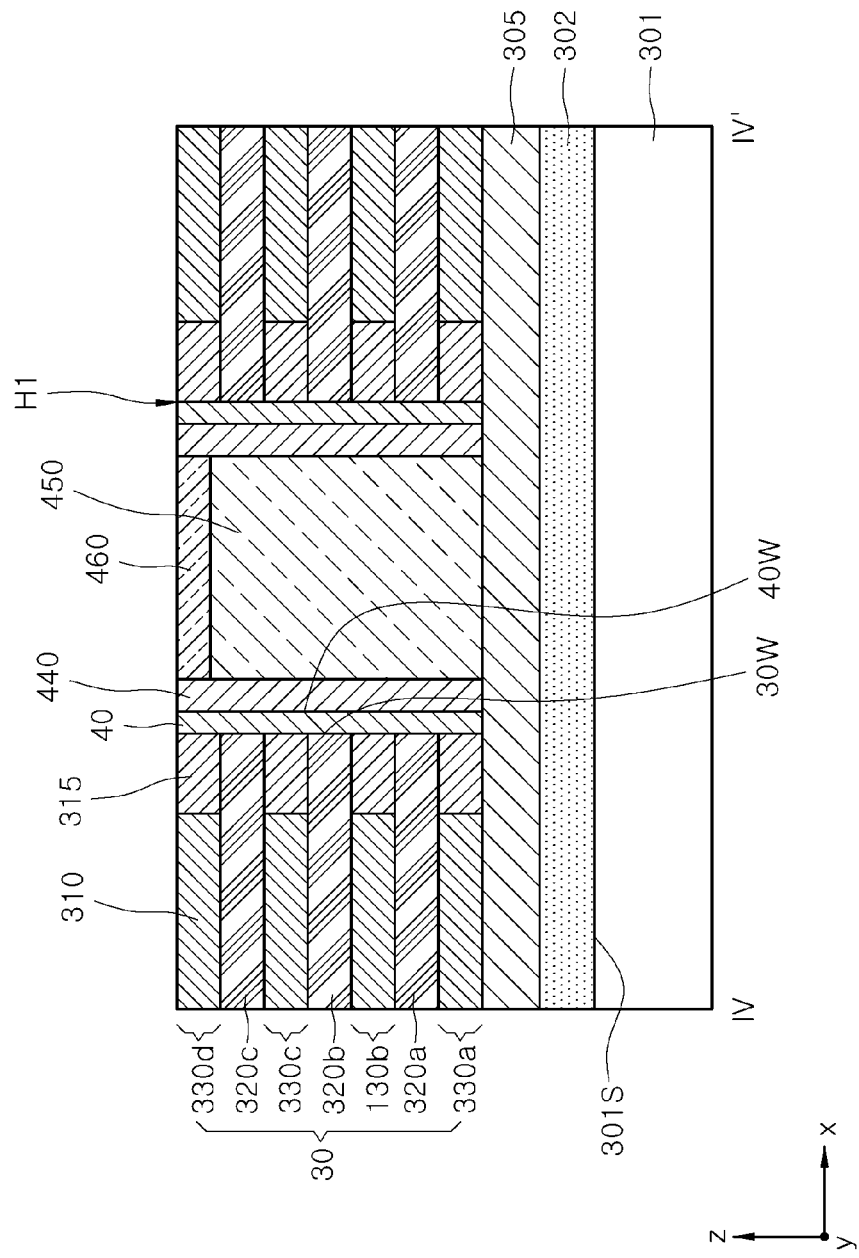
FIG. 14 is a cross-sectional view taken along the line IV-IV' of the semiconductor device of FIG. 13.

FIG. 13 is a schematic perspective view illustrating a semiconductor device according to another embodiment of the present disclosure. FIG. 14 is a cross-sectional view taken along the line IV-IV' of the semiconductor device of FIG. 13.

Referring to FIGS. 13 and 14, a semiconductor device 4 may include a substrate 301, an electrode structure 30 disposed over the substrate 301, and a dielectric structure 40. The dielectric structure 40 may be disposed to contact a sidewall surface 30W of the electrode structure 30. The semiconductor device 4 may also include a vertical electrode layer 440 disposed on a sidewall surface 40W of the dielectric structure 40 and over the substrate 301. In an embodiment, the semiconductor device 4 may be a resistance change memory device in which the dielectric structure 40 serves as a resistive memory element.

Referring to FIGS. 13 and 14, the substrate 301 may be provided. A base insulation layer 302 may be disposed on the substrate 301. A lower conductive layer 305 may be disposed on the base insulation layer 302. The configurations of the substrate 301 and the base insulation layer 302 of the semiconductor device 4 may be substantially the same as the configurations of the substrate 101 and the base insulation layer 102 of the semiconductor device 1 described with reference to FIGS. 3 and 4. The lower conductive layer 305 may include a conductive material. In an embodiment, the lower conductive layer 305 may be electrically connected to a source line. The lower conductive layer 305 may be made of substantially the same material as the channel lower contact layer 105 of the semiconductor device 1 described with reference to FIGS. 3 and 4. The lower conductive layer 305 may be electrically connected to the vertical electrode layer 440.

The electrode structure 30 may be disposed on the lower conductive layer 305. The electrode structure 30 may include first to third horizontal electrode layers 320a, 320b, and 320c and first to fourth interlayer insulation structures 330a, 330b, 330c, and 330d, which are alternately stacked with each other. The first to third horizontal electrode layers 320a, 320b, and 320c may be respectively disposed on planes substantially parallel to a surface 301S of the substrate 301. Similarly, the first to fourth interlayer insulation structures 330a, 330b, 330c, and 330d may be respectively disposed on planes substantially parallel to the surface 301S of the substrate 301.

Each of the first to third horizontal electrode layers 320a, 320b, and 320c may include a conductive material. In an embodiment, the first to third horizontal electrode layers 320a, 320b, and 320c may be formed of substantially the same material and formed in substantially the same structural configuration as the first to third gate electrode layers 120a, 120b, and 120c described with reference to FIGS. 3 and 4. The first to fourth interlayer insulation structures 330a, 330b, 330c, and 330d may be substantially the same as the first to fourth interlayer insulation structures 130a, 130b, 130c, and 130d described with reference to FIGS. 3 and 4. That is, each of the first to fourth interlayer insulation structures 330a, 330b, 330c, and 330d may include an insulation layer 310 and a metal-organic framework layer 315. The insulation layers 310 and the metal-organic framework layers 315 may be substantially the same as the insulation layers 110 and the metal-organic framework layers 115 described with reference to FIGS. 3 and 4.

Referring to FIGS. 13 and 14, the electrode structure 30 may include a hole pattern H1. The hole pattern H1 may be formed to penetrate the electrode structure 30 to expose the lower conductive layer 305. In addition, the hole pattern H1 may be formed to expose the sidewall surface 30W of the electrode structure 30.

On the lower conductive layer 305, the dielectric structure 40 may be disposed inside the hole pattern H1. The dielectric structure 40 may be disposed to contact the sidewall surface 30W of the electrode structure 30. In an embodiment, the dielectric structure 40 may include a variable resistance layer including a resistance change material. The resistance change material may refer to, for example, a material whose internal electrical resistance is changed by an external stimulus such as a voltage or current applied from the outside. In addition, the resistance change material may non-volatilely store the changed electrical resistance after the external stimulus is removed. The dielectric structure 40 may include a single variable resistance layer or may include two or more variable resistance layers.

The variable resistance layer may include, as the resistance change material, metal oxide having oxygen vacancies or movable metal ions. In an embodiment, the electrical resistance of the metal oxide may change according to the concentration and distribution state of the oxygen vacancies or the movable metal ions. The metal oxide may include, for example, lithium oxide, titanium oxide, nickel oxide, copper oxide, manganese oxide, hafnium oxide, zirconium oxide, tungsten oxide, niobium oxide, vanadium oxide, or a combination of two or more thereof.

Referring to FIGS. 13 and 14, the vertical electrode layer 440 may be disposed on the sidewall surface 40W of the dielectric structure 40. The vertical electrode layer 440 may extend in a direction substantially perpendicular to the surface 301S of the substrate 301. The vertical electrode layer 440 may include a conductive material. The vertical electrode layer 440 may be made of substantially the same material as the first to third horizontal electrode layers 330a, 330b, and 330c.

Referring again to FIGS. 13 and 14, a filling insulation structure 450 may be disposed inside the hole pattern H1 in which the dielectric structure 40 and the vertical electrode layer 440 are disposed. The filling insulation structure 450 may include, for example, oxide, nitride, oxynitride, or a combination of two or more thereof.

In addition, an upper conductive layer 460 may be disposed on the filling insulation structure 450 in the hole pattern H1. The upper conductive layer 460 may be electrically connected to the vertical electrode layer 440. Although not illustrated, the upper conductive layer 460 may be electrically connected to a bit line. The upper conductive layer 460 may include a conductive material. The upper conductive layer 460 may be made of substantially the same material as the channel upper contact layer 260 of the semiconductor device 1 described with reference to FIGS. 3 and 4.

According to an embodiment of the present disclosure, when an operation voltage is applied between a horizontal electrode layer, selected from among the first to third horizontal electrode layers 320a, 320b, and 320c, and the vertical electrode layer 440 of the semiconductor device 4, electrical resistance in the region of the dielectric structure 40 controlled by the operation voltage may be reversibly changed. The changed electrical resistance may be non-volatilely stored as signal information of the corresponding memory cell. That is, the region of the dielectric structure 40 in which the horizontal electrode layer and the vertical electrode layer 440 overlap with each other may function as a variable resistance memory layer of the nonvolatile memory cell.

In an embodiment of the present disclosure, as described above, the metal-organic framework layers 315 of the first to fourth interlayer insulation structures 330a, 330b, 330c, and 330d may effectively reduce unwanted fringing electric fields generated between the first to third horizontal electrode layers 320a, 320b, and 320c and the vertical electrode layer 440. Accordingly, it is possible to reduce deterioration of the electrical resistance stored in the variable resistance memory layer of the memory cell because of a fringing electric field. In addition, the metal-organic framework layers 315, which has a low dielectric constant, may reduce parasitic capacitance generated between the first to third horizontal electrode layers 320a, 320b, and 320c. As a result, reliability of signal information stored in the memory cell may be improved.

FIGS. 15 to 20 are schematic cross-sectional views illustrating a method of manufacturing a semiconductor device according to an embodiment of the present disclosure. The method described with reference to FIGS. 15 to 20 may be applied to methods of manufacturing the semiconductor device 1 of FIGS. 3 and 4, the semiconductor device 3 of FIGS. 10 and 11, and the semiconductor device 4 of FIGS. 13 and 14.

Figure 15:
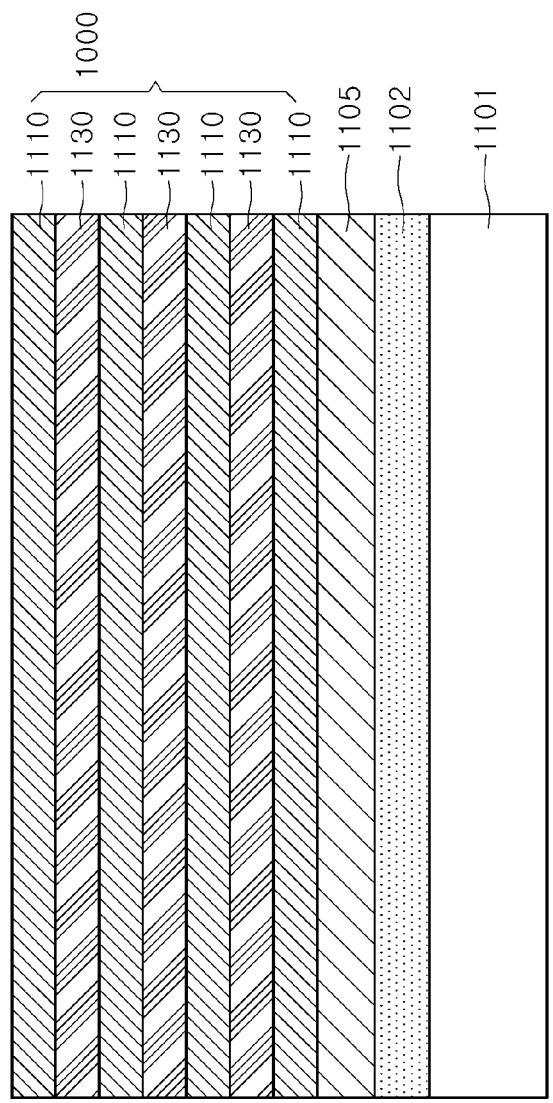
FIGS. 15 to 20 are schematic cross-sectional views illustrating a method of manufacturing a semiconductor device according to an embodiment of the present disclosure.

Referring to FIG. 15, a substrate 1101 including a base insulation layer 1102 may be provided. The substrate 1101 and the base insulation layer 1102 may be substantially the same as the substrate 101 and the base insulation layer 102 of the semiconductor device 1 described with reference to FIGS. 3 and 4.

A lower conductive layer 1105 may be formed on the base insulation layer 1102. The lower conductive layer 1105 may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The lower conductive layer 1105 may be formed using, for example, a chemical vapor deposition method, a physical vapor deposition method, an atomic layer deposition method, or the like.

A stack structure 1000 may be formed on the lower conductive layer 1105. The stack structure 1000 may include insulation material layers 1110 and first conductive material layers 1130, which are alternately stacked. Insulation material layers 1110 may be disposed as a lowermost layer and an uppermost layer of the stack structure 1000.

The insulation material layer 1110 and the first conductive material layer 1130 may have an etch selectivity relative to each other. The insulation material layer 1110 may include, for example, oxide, nitride, oxynitride, or a combination of two or more thereof. The first conductive material layer 1130 may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Figure 16:
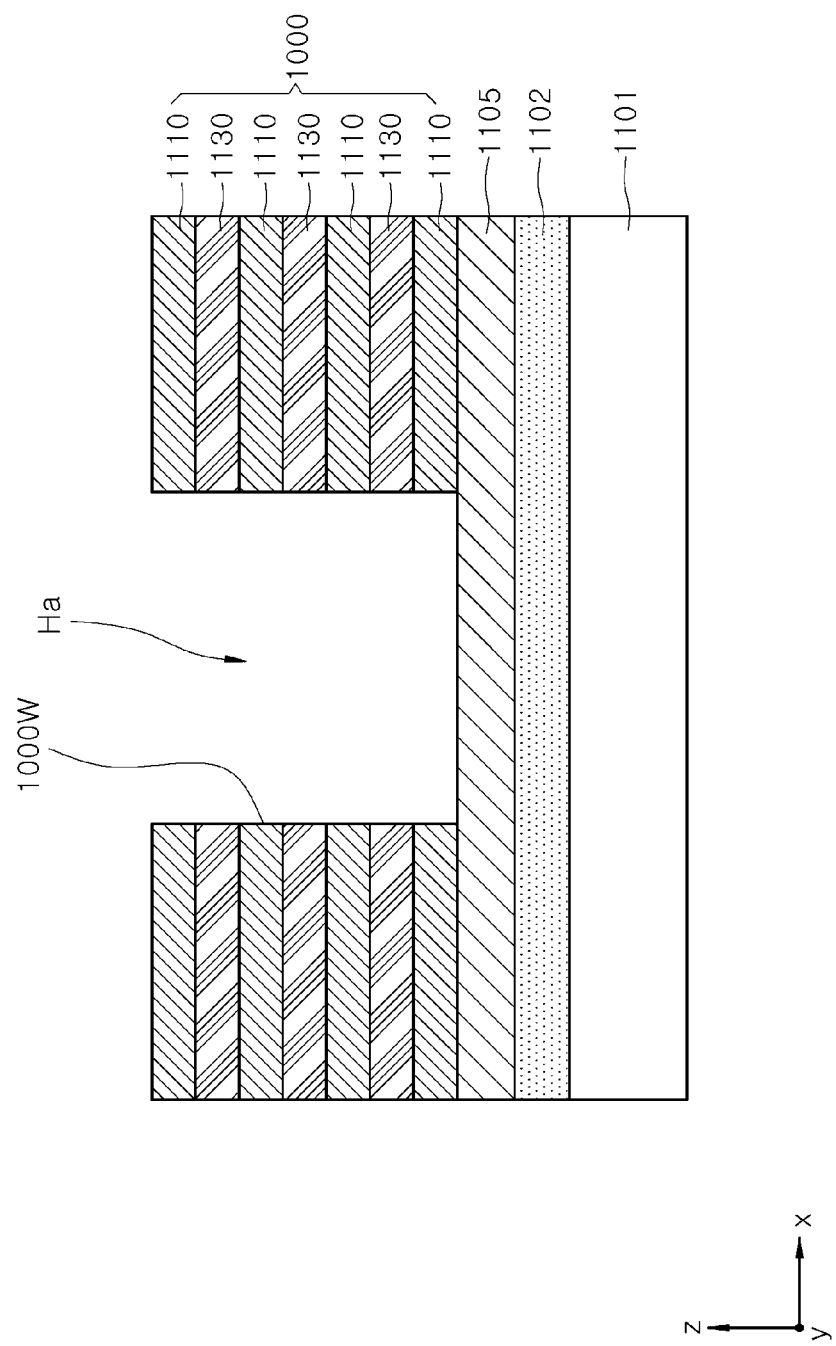

Referring to FIG. 16, a hole pattern Ha may be formed by selectively etching the stack structure 1000 on the lower conductive layer 1105. A sidewall surface 1000W of the stack structure 1000 may be exposed through the hole pattern Ha. In addition, the lower conductive layer 1105 may be exposed through the hole pattern Ha. The etching of the stack structure 1000 may be performed through a photolithography process and an anisotropic etching process. As an example, a dry etching method using plasma may be utilized as the anisotropic etching process.

Figure 17:
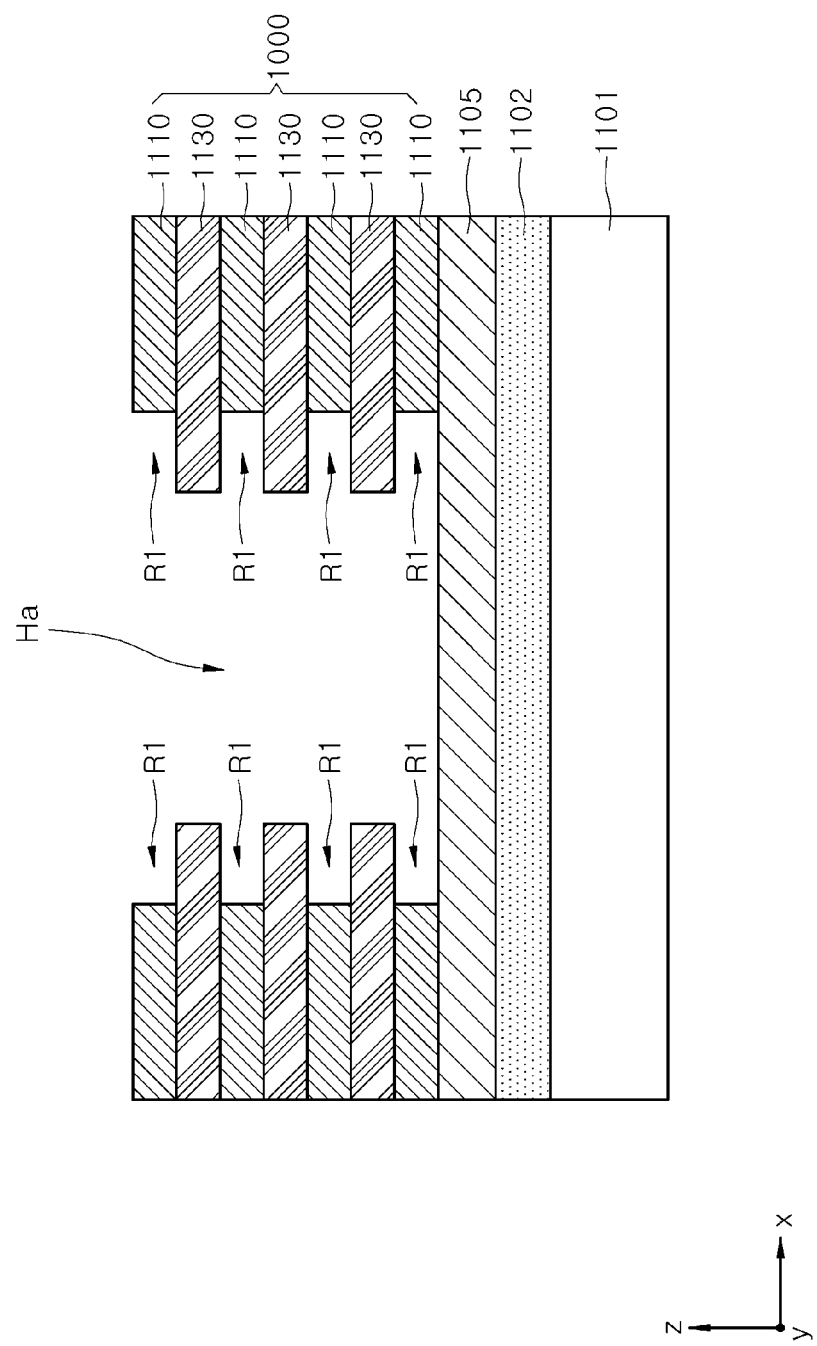

Referring to FIG. 17, first recess spaces R1 may be formed by partially removing the insulation material layers 1110 of the stack structure 1000 of FIG. 16. The process of partially removing the insulation material layers 1110 may be performed through an isotropic etching process. In an embodiment, the process of partially removing the insulation material layers 1110 may include a method of wet etching the insulation material layers 1110 by providing, into the hole pattern Ha, an etchant having an etch selectivity with respect to the first conductive material layers 1130. In order to partially remove the uppermost insulation material layer 1110 of the stack structure 1000, an etch mask pattern may be formed on the uppermost insulation material layer 1110. The etch mask pattern may expose only portions of the uppermost insulation material layer 1110 to be removed by etching while not etching the lower conductive layer 1105 while the wet etching is performed.

Figure 18:
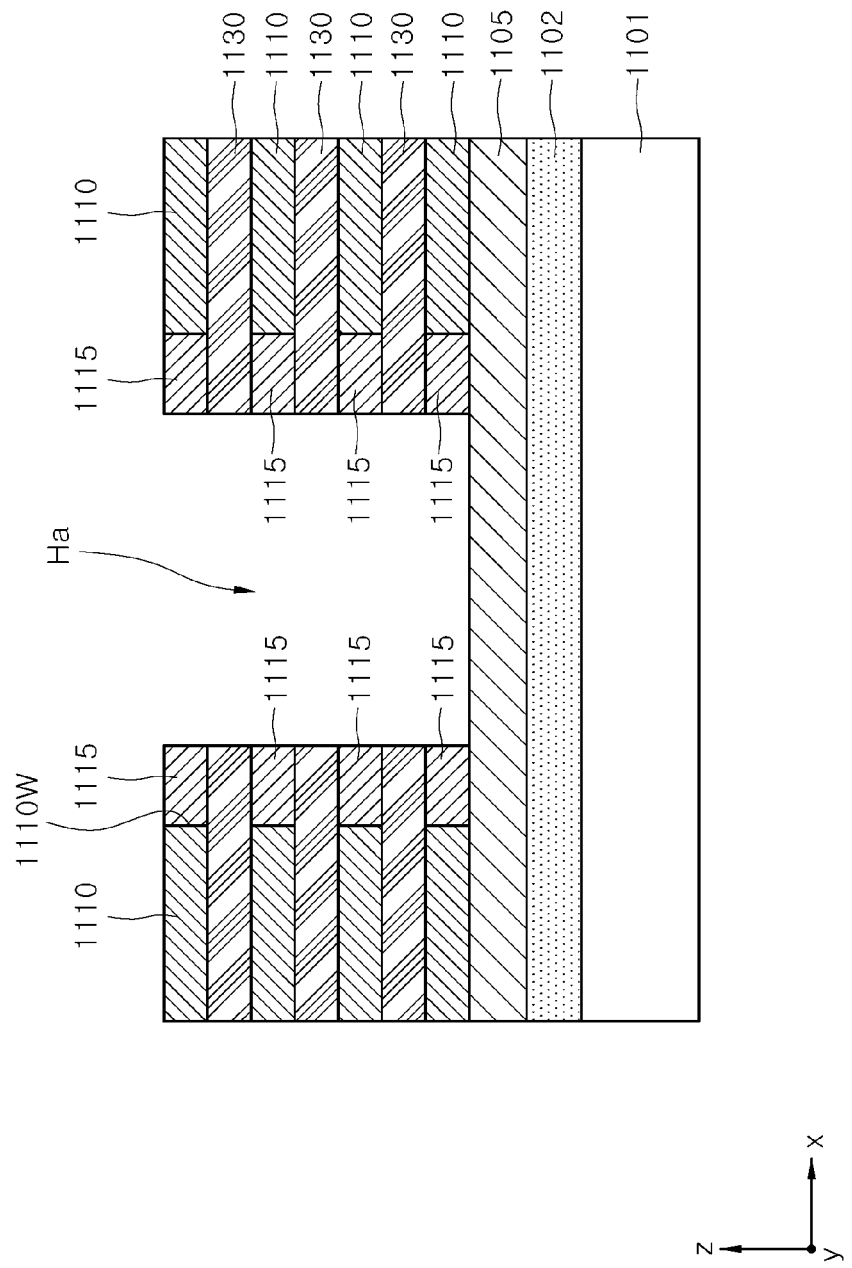

Referring to FIG. 18, metal-organic framework layers 1115 may be formed to fill the first recess spaces R1. As described with reference to FIG. 2, in an embodiment each of the metal-organic framework layers 1115 may have a form in which a plurality of metal-organic frameworks M1, M2, M3, and M4 having a sheet shape are stacked in a thickness direction. Each of the plurality of metal-organic frameworks M1, M2, M3, and M4 may be bonded to each other, through the Van der Waals force, to form the metal-organic framework layer 1115.

Each of the plurality of metal-organic frameworks M1, M2, M3, and M4 may be a material formed by coordination bond between nodes including metal and organic ligands, as illustrated in FIG. 1. A node including metal may be, for example, a metal ion or a metal cluster. The metal may include, for example, zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), aluminum (Al), or the like. The organic ligand may include, as an example, oxalic acid, fumaric acid, benzenehexathiol, triphenylenehexathiol, 1,4-benzene dicarboxylic acid, hexaaminobenzene, tetrakis (4-carboxyphenyl)-porphyrinato-cobalt (II), tetrakis (4-carboxyphenyl)-porphyrin, and the like. As another example, the organic ligand may include $H_2BDC$, $H_2BDC\text{-Br}$, $H_2BDC\text{-OH}$, $H_2BDC\text{-NO}_2$, $H_2BDC\text{-NH}_2$, $H_4DOT$, $H_2BDC\text{-(Me)}_2$, $H_2BDC\text{-(Cl)}_2$, or the like.

In an embodiment, the process of forming the metal-organic framework layers 1115 may be performed using an atomic layer deposition method. The metal-organic framework layers 1115 may be formed by stacking metal-organic frameworks that are formed to include cavities. The metal-organic framework layers 1115 may mainly grow on sidewall surfaces 1110W of the insulation material layers 1110 in a direction (e.g., the x-direction) perpendicular to the sidewall surface 1110W. The rate at which the metal-organic framework layers 1115 grow on the sidewall surfaces 1110W of the insulation material layers 1110 may be sufficiently greater than the rate at which the metal-organic framework layers 1115 grow on the first conductive material layers 1130. In an atomic layer deposition method, as an example, trimethylaluminum ($AlMe_3$) or dimethylaluminum isopropoxide ($[Al\text{-}Me_2{}^iOPr]_2$) may be used as a precursor. In some embodiments, the metal-organic framework layers 1115 may grow on an upper surface as well as the sidewall surfaces 1110W of an uppermost layer of the insulation material layers 1110. In this case, after the formation of the metal-organic framework layers 1115, portions of the metal-organic framework layers 1115 on the upper surface may be removed. Removing the portions of the metal-organic framework layers 1115 on the upper surface may be performed by etching method or chemical mechanical polishing method.

Figure 19:
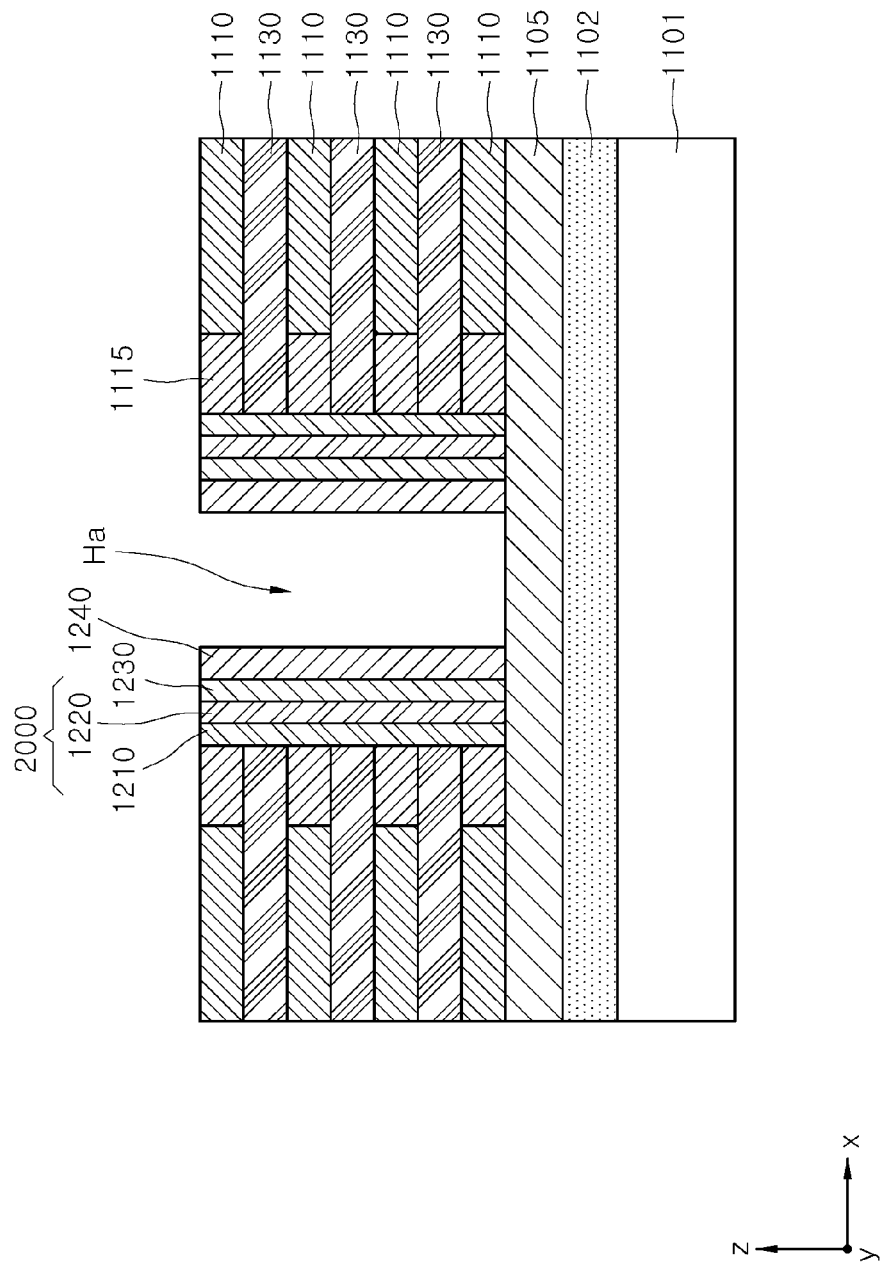

Referring to FIG. 19, a dielectric structure 2000 in contact with the metal-organic framework layers 1115 and the first conductive material layers 1130 may be formed in the hole pattern Ha. A process of forming the dielectric structure 2000 may include a process of forming a first dielectric layer 1210 on sidewall surfaces of the metal-organic framework layers 1115 and the first conductive material layers 1130 in the hole pattern Ha, a process of forming a second dielectric layer 1220 on a sidewall surface of the first dielectric layer 1210, and a process of forming a third dielectric layer 1230 on a sidewall surface of the second dielectric layer 1220.

The process of forming each of the first to third dielectric layers 1210, 1220, and 1230 may include depositing a dielectric thin film and patterning the dielectric thin film to be disposed on a plane parallel to the z-direction. In the process of depositing the dielectric thin film, as an example, a chemical vapor deposition method, an atomic layer deposition method, a sputtering method, etc. may be applied. The process of patterning the dielectric thin film may include, for example, an anisotropic etching method using plasma.

In an embodiment, the first to third dielectric layers 1210, 1220, and 1230 may correspond to the barrier layer 210, the charge storage layer 220, and the tunneling layer 230 of the dielectric structure 20 described with reference to FIGS. 3 and 4, respectively. In another embodiment, the first dielectric layer 1210 and the second dielectric layer 1220 may correspond to the ferroelectric layer 215 and the interfacial insulation layer 225 of the dielectric structure 22 described with reference to FIGS. 10 and 11, respectively. In such an embodiment, the third dielectric layer 1230 that is illustrated in FIG. 19 may be omitted. In another embodiment, the first to third dielectric layers 1210, 1220, and 1230 may correspond to the dielectric structure 40 described with reference to FIGS. 13 and 14. Accordingly, at least one of the first to third dielectric layers 1210, 1220, and 1230 may be a variable resistance layer including a resistance change material. In a further embodiment, when the dielectric structure 40 is formed in a single variable resistance layer, only one of the first to third dielectric layers 1210, 1220, and 1230 may be formed, and the remaining dielectric layers may be omitted.

Referring to FIG. 19, a second conductive material layer 1240 in contact with the dielectric structure 2000 may be formed on the lower conductive layer 1105. The second conductive material layer 1240 may include a conductive material. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The process of forming the second conductive material layer 1240 may include depositing a conductive material film on the structure in which the dielectric structure 2000 is formed and patterning the conductive material film so that the material is disposed on a plane parallel to the z-direction. In the process of depositing the conductive material layer, as an example, a chemical vapor deposition method, an atomic layer deposition method, a sputtering method, etc. may be applied. In the process of patterning the conductive material, as an example, an anisotropic etching method using plasma may be applied.

Figure 20:
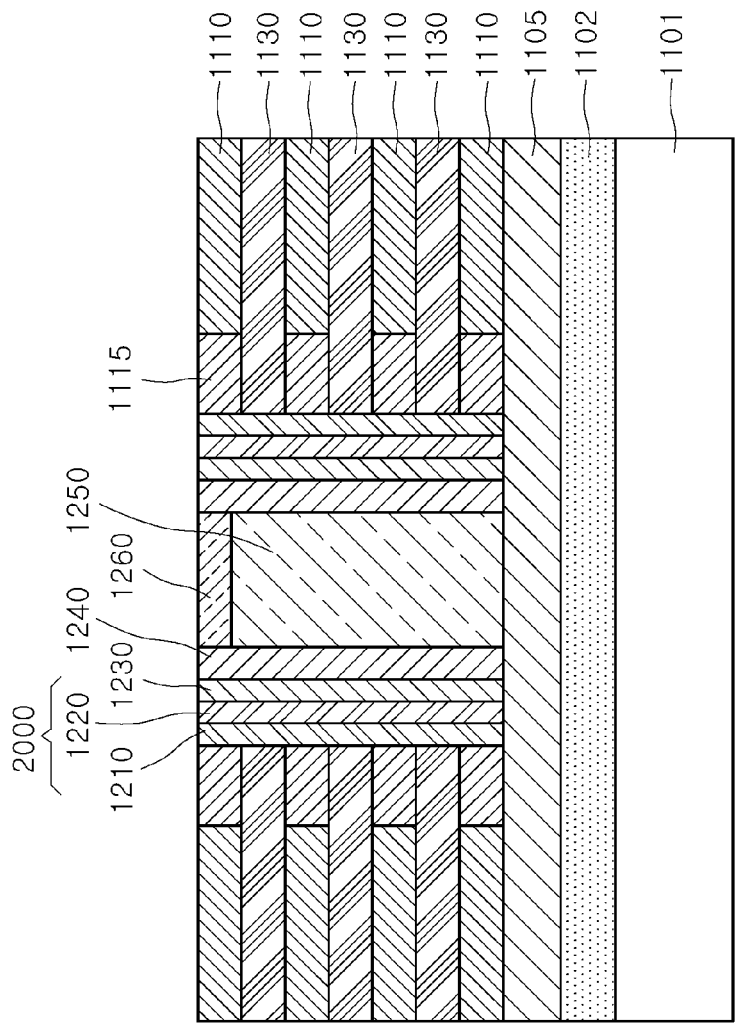

Referring to FIG. 20, the hole pattern Ha in which the dielectric structure 2000 and the second conductive material layer 1240 are formed may be filled with an insulation material to form a filling insulation structure 1250. The filling insulation structure 1250 may include, as an example, oxide, nitride, oxynitride, or a combination of two or more thereof. In the process of forming the filling insulation structure 1250, as an example, a chemical vapor deposition method, a coating method, a sputtering method, or the like may be applied.

Next, an upper portion of the filling insulation structure 1250 may be removed to expose a portion of the second conductive material layer 1240 in hole pattern Ha. Next, an upper conductive layer 1260 may be formed to contact the exposed portion of the second conductive material layer 1240. The upper conductive layer 1260 may include a conductive material. The upper conductive layer 1260 may, as an example, be formed of substantially the same material as the lower conductive layer 1105. The upper conductive layer 1260 may be formed using, as an example, a chemical vapor deposition method, an atomic layer deposition method, or the like. The semiconductor device according to an embodiment of the present disclosure may be manufactured through the above-described processes.

FIGS. 21 to 25 are schematic cross-sectional views illustrating a method of manufacturing a semiconductor device according to another embodiment of the present disclosure. The method to be described with reference to FIGS. 21 to 25 may be applied to a method of manufacturing a semiconductor device 2 of FIGS. 7 and 8.

Figure 21:
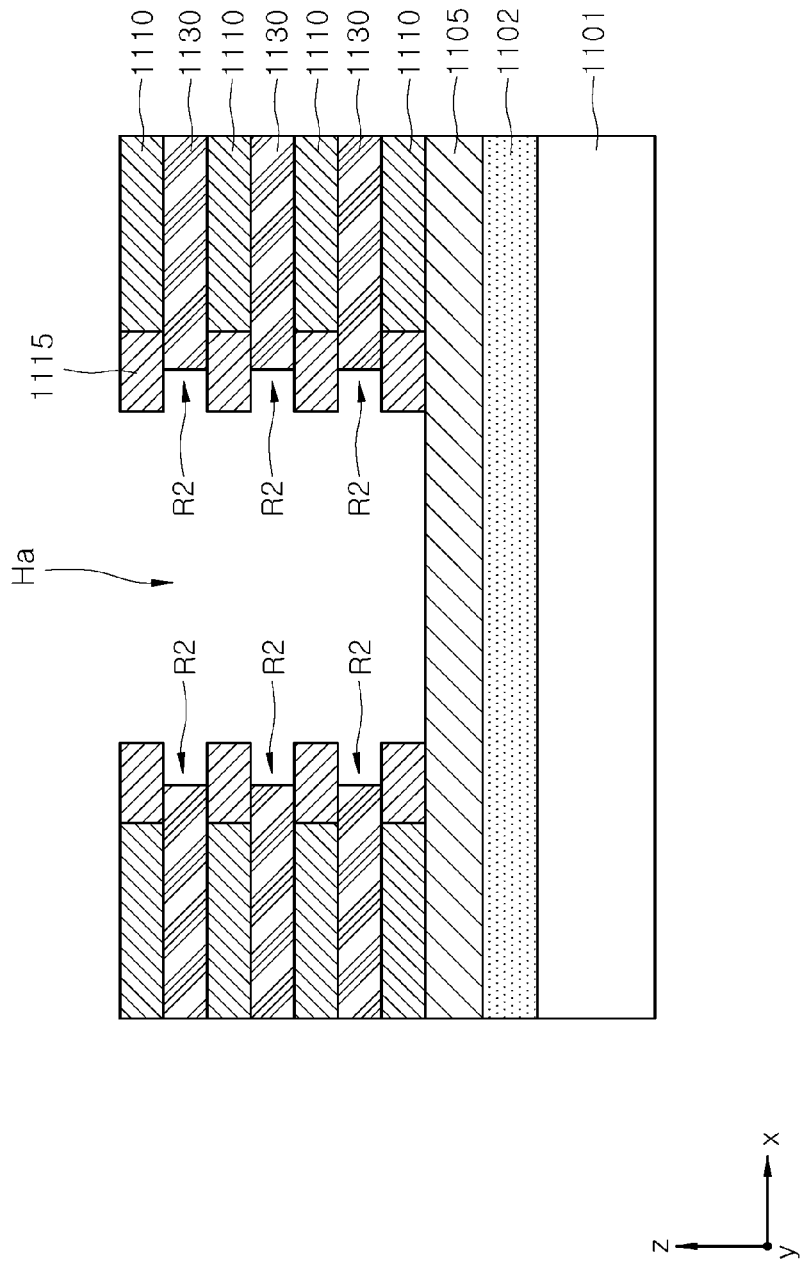
FIGS. 21 to 25 are schematic cross-sectional views illustrating a method of manufacturing a semiconductor device according to another embodiment of the present disclosure.

The method of manufacturing the semiconductor device in FIGS. 21 to 25 may include the processes described above with reference to FIGS. 15 to 18. The processes described in connection with FIGS. 21 to 25 may be performed after performing the method of manufacturing the semiconductor device described above through FIGS. 15 to 18. Referring to FIG. 21, in the structure of the semiconductor device of FIG. 18, the first conductive material layers 1130 may be partially removed to form second recess spaces R2. The process of partially removing the first conductive material layers 1130 may be performed through an anisotropic etching process. In an embodiment, the process of partially removing the first conductive material layers 1130 may include a process of wet etching the first conductive material layers 1130 by providing, into the hole pattern Ha, an etchant having an etch selectivity with respect to the metal-organic framework layers 1115.

Figure 22:
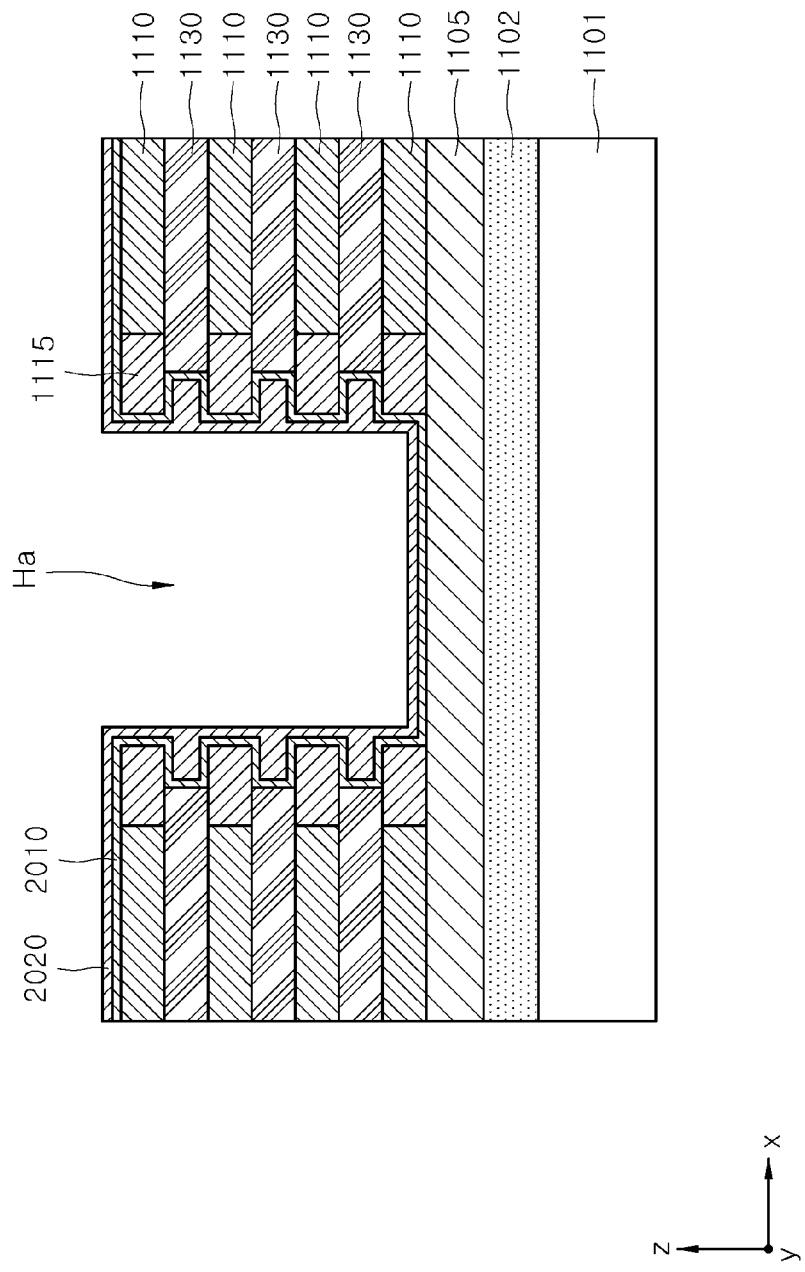

Referring to FIG. 22, a first dielectric layer 2010 and a second dielectric layer 2020 may be sequentially deposited on the structure of FIG. 21. The first dielectric layer 2010 and the second dielectric layer 2020 may be formed to fill at least the second recess spaces R2. A process of depositing the first dielectric layer 2010 and the second dielectric layer 2020 may be performed by, for example, a chemical vapor deposition method, an atomic layer deposition method, a sputtering method, or the like.

Figure 23:
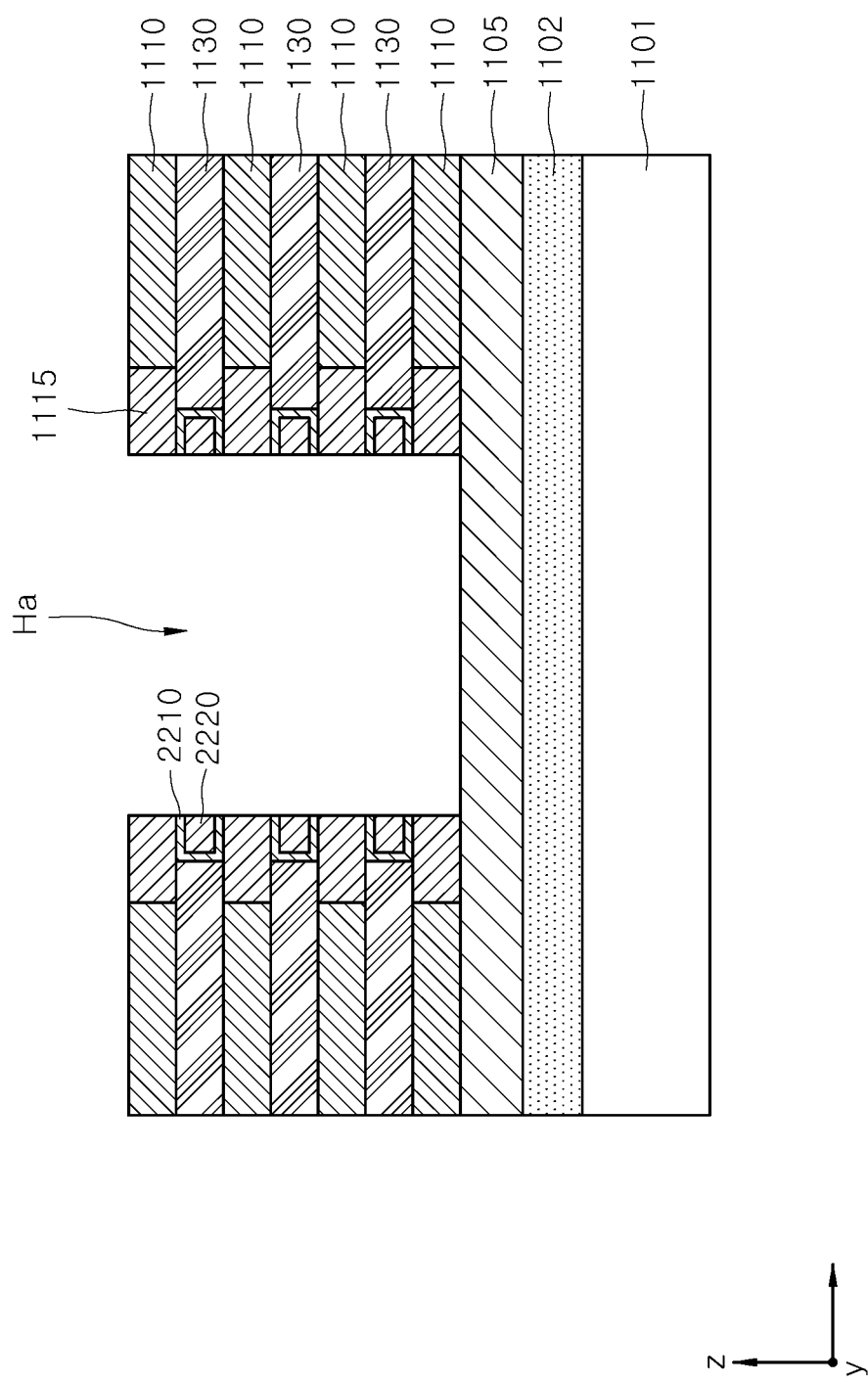

Referring to FIG. 23, in the structure of FIG. 22, the first and second dielectric layers 2010 and 2020 outside the second recess spaces R2 may be removed to form the first dielectric layer 2210, and the second dielectric layer 2220. According to an embodiment, an anisotropic etching method may be applied. As a method of removing the undesired portions of first and second dielectric layers 2010 and 2020, as an example, an anisotropic etching method using plasma may be applied.

Figure 24:
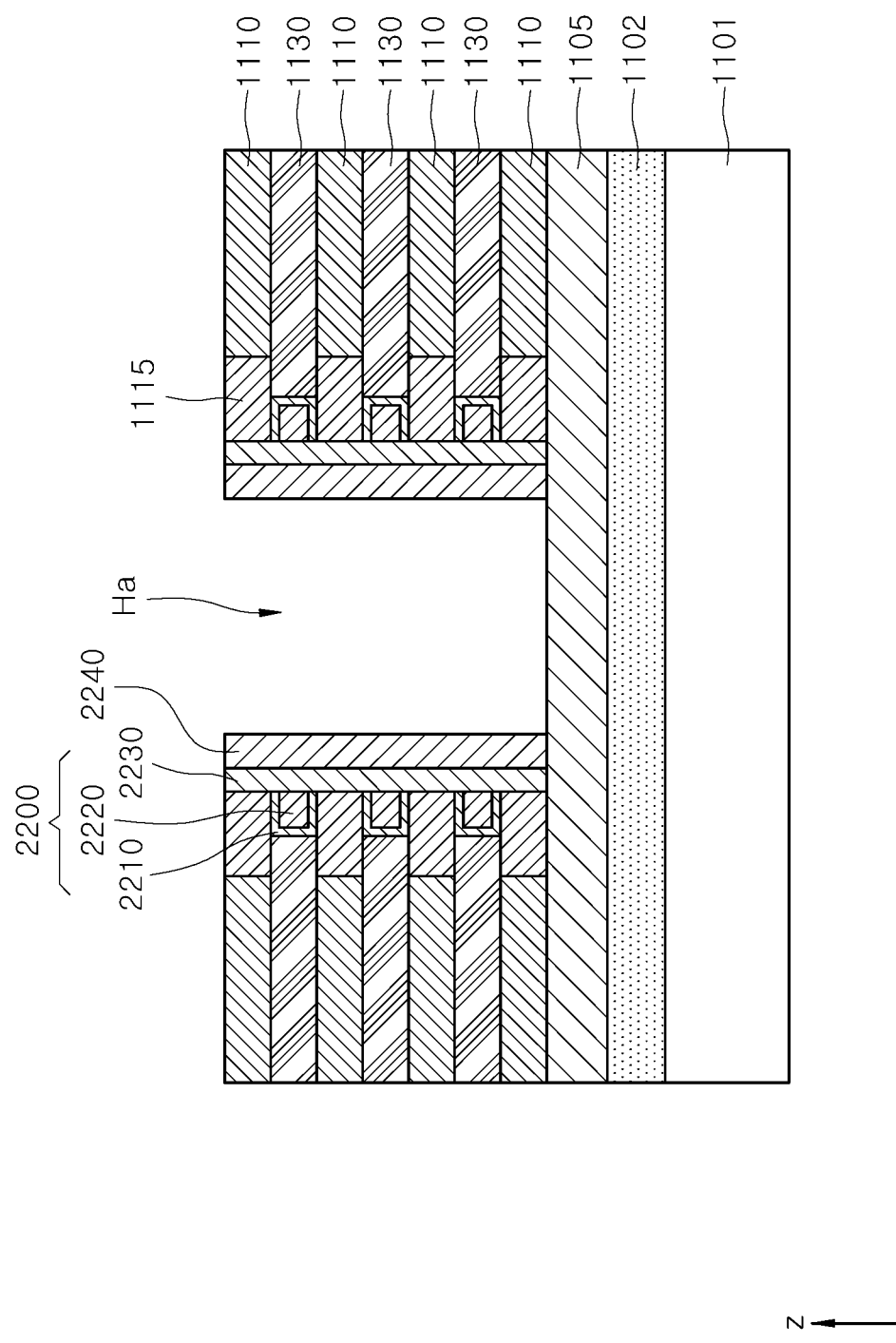

Referring to FIG. 24, a third dielectric layer 2230 in contact with the metal-organic framework layers 1115, the first dielectric layer 2210, and the second dielectric layer 2220 may be formed in the hole pattern Ha of the structure of FIG. 23. As an example, the process of forming the third dielectric layer 2230 may include depositing a dielectric thin film on the structure of FIG. 23 and patterning the dielectric thin film to be disposed on a plane parallel to the z-direction. In the process of depositing the dielectric thin film, as an example, a chemical vapor deposition method, an atomic layer deposition method, a sputtering method, or the like may be applied. The process of patterning the dielectric thin film may include, for example, an anisotropic etching method using plasma. Through the above-described processes, a dielectric structure 2200 including the first to third dielectric layers 2210, 2220, and 2230 may be formed. The dielectric structure 2200 may correspond to the dielectric structure 21 of a semiconductor device 2 described with reference to FIGS. 7 and 8.

Referring again to FIG. 24, a second conductive material layer 2240 in contact with the dielectric structure 2200 may be formed on the lower conductive layer 1105 and inside the hole pattern Ha. The process of forming the second conductive material layer 2240 may be substantially the same as the process of forming the second conductive material layer 1240 described with reference to FIG. 19.

Figure 25:
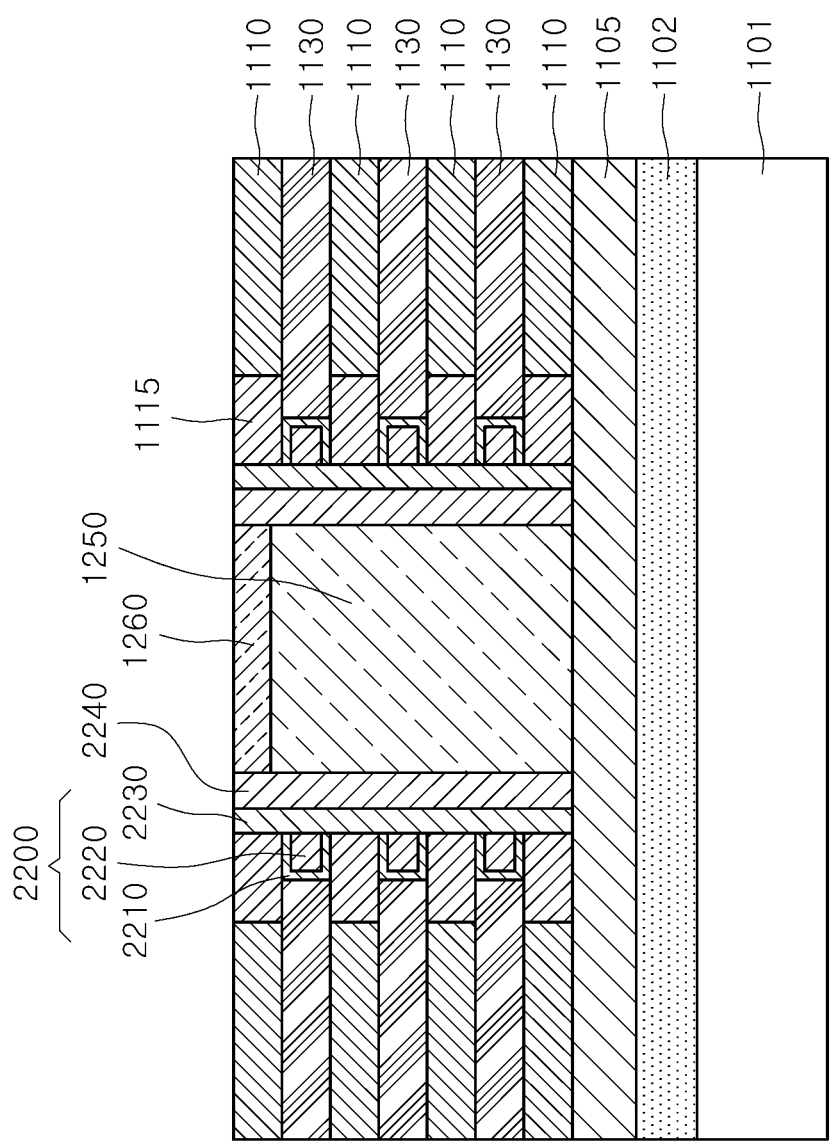

Referring to FIG. 25, the hole pattern Ha in which the dielectric structure 2200 and the second conductive material layer 2240 are formed may be filled with an insulation material to form a filling insulation structure 1250. Next, an upper portion of the filling insulation structure 1250 may be removed, and an upper portion of the second conductive material layer 2240 may be exposed inside the hole pattern Ha. Next, an upper conductive layer 1260 may be formed to contact the exposed upper portion of the second conductive material layer 2240. The semiconductor device according to an embodiment of the present disclosure may be manufactured through the above-described processes.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising;
a substrate;
a gate structure disposed over the substrate, the gate structure including gate electrode layers and interlayer insulation structures that are alternately stacked with each other;
a dielectric structure disposed over the substrate to contact a sidewall surface of the gate structure; and
a channel layer disposed on a sidewall surface of the dielectric structure over the substrate,
wherein each of the interlayer insulation structures includes an insulation layer and a metal-organic framework layer that are disposed on the same plane,
wherein the insulation layer and the metal-organic framework layer contact portions of the gate electrode layer, respectively.

2. The semiconductor device of claim 1, wherein the insulation layer and the metal-organic framework layer are disposed to contact each other in a direction parallel to a surface of the substrate.

3. The semiconductor device of claim 1, wherein the metal-organic framework layer is disposed closer to the dielectric structure than the insulation layer.

4. The semiconductor device of claim 1, wherein the gate electrode layers are disposed to contact the insulation layer and the metal-organic framework layer in a direction perpendicular to a surface of the substrate.

5. The semiconductor device of claim 1, wherein the insulation layer includes at least one of oxide, nitride, and oxynitride.

6. The semiconductor device of claim 1, wherein the metal-organic framework layer includes a porous structure.

7. The semiconductor device of claim 1, wherein the metal-organic framework layer includes a metal-organic framework that includes cavities.

8. The semiconductor device of claim 1,
wherein the dielectric structure includes:
a barrier layer disposed on the sidewall surface of the gate structure;
a charge storage layer disposed on a sidewall surface of the barrier layer; and
a tunnel layer disposed on a sidewall surface of the charge storage layer.

9. The semiconductor device of claim 1, wherein sidewall surfaces of the gate electrode layers are located, in a direction parallel to the surface of the substrate, farther from the channel layer than sidewall surfaces of the interlayer insulation structures.

10. The semiconductor device of claim 9,
wherein the dielectric structure includes:
a barrier layer in contact with the gate electrode layers in a direction parallel to the surface of the substrate and in contact with the metal-organic framework layer in a direction perpendicular to the surface of the substrate;
a charge storage layer disposed on a sidewall surface of the barrier layer; and
a tunnel layer disposed to contact the barrier layer, the charge storage layer, and the metal-organic framework layer.

11. The semiconductor device of claim 1,
wherein the dielectric structure includes:
a ferroelectric memory layer disposed on the sidewall surface of the gate structure; and
an interfacial insulation layer disposed on a sidewall surface of the ferroelectric memory layer.

12. A semiconductor device comprising;
a substrate;
an electrode structure disposed over the substrate, the electrode structure including horizontal electrode layers and interlayer insulation structures that are alternately stacked with each other;
a dielectric structure disposed over the substrate to contact a sidewall surface of the electrode structure; and
a vertical electrode layer disposed on a sidewall surface of the dielectric structure, over the substrate and extending in a direction perpendicular to a surface of the substrate,
wherein each of the interlayer insulation structures includes an insulation layer and a metal-organic framework layer that are disposed on the same plane,
wherein the insulation layer and the metal-organic framework layer contact portions of the horizontal electrode layers, respectively.

13. The semiconductor device of claim 12, wherein the insulation layer and the metal-organic framework layer are disposed to contact each other in a direction parallel to the surface of the substrate.

14. The semiconductor device of claim 12, wherein the metal-organic framework layer is disposed closer to the dielectric structure than the insulation layer.

15. The semiconductor device of claim 12, wherein the insulation layer includes at least one of oxide, nitride, and oxynitride.

16. The semiconductor device of claim 12, wherein the metal-organic framework layer includes a porous structure.

17. The semiconductor device of claim 12, wherein the metal-organic framework layer includes a metal-organic framework with cavities.

* * * * *